(12) United States Patent
Sakata et al.

(10) Patent No.: US 9,837,434 B2
(45) Date of Patent: Dec. 5, 2017

(54) SEMICONDUCTOR MEMORY DEVICE AND METHOD FOR MANUFACTURING SAME

(71) Applicant: Toshiba Memory Corporation, Minato-ku (JP)

(72) Inventors: Koichi Sakata, Yokkaichi (JP); Yuta Watanabe, Yokkaichi (JP); Keisuke Kikutani, Yokkaichi (JP); Satoshi Nagashima, Yokkaichi (JP); Fumitaka Arai, Yokkaichi (JP); Toshiyuki Iwamoto, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/267,722

(22) Filed: Sep. 16, 2016

(65) Prior Publication Data

US 2017/0263637 A1    Sep. 14, 2017

Related U.S. Application Data

(60) Provisional application No. 62/307,848, filed on Mar. 14, 2016.

(51) Int. Cl.
*H01L 21/336* (2006.01)
*H01L 27/115* (2017.01)
(Continued)

(52) U.S. Cl.
CPC .. *H01L 27/11582* (2013.01); *H01L 21/28282* (2013.01); *H01L 21/31111* (2013.01); *H01L 27/11565* (2013.01)

(58) Field of Classification Search
CPC ......... H01L 27/11582; H01L 27/11565; H01L 21/28282; H01L 21/31111
(Continued)

(56) References Cited

U.S. PATENT DOCUMENTS 8,674,426 B2    3/2014  Higuchi et al.
9,431,412 B1 *  8/2016  Kato ................ H01L 27/11556
(Continued)

FOREIGN PATENT DOCUMENTS

JP    2011-165815 A    8/2011
JP    2014-187332 A    10/2014
(Continued)

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A semiconductor memory device according to one embodiment, includes a first electrode film, a plurality of semiconductor members, and a charge storage member. The first electrode film includes three or more first portions and a second portion connecting the first portions to each other. The first portions extend in a first direction and are arranged along a second direction that intersects with the first direction. The plurality of semiconductor members are arranged along the first direction between the first portions and extending in a third direction. The third direction intersects with a plane containing the first direction and the second direction. The charge storage member is disposed between each of the semiconductor members and each of the first portions. The second portion is disposed between the semiconductor members.

20 Claims, 25 Drawing Sheets

(51) Int. Cl.
*H01L 27/11582* (2017.01)
*H01L 27/11565* (2017.01)
*H01L 21/28* (2006.01)
*H01L 21/311* (2006.01)

(58) Field of Classification Search
USPC .................................................. 257/324, 326
See application file for complete search history.

(56) References Cited

U.S. PATENT DOCUMENTS

| | | |
|---|---|---|
| 2014/0284687 A1 | 9/2014 | Murakami |
| 2015/0001460 A1 | 1/2015 | Kim et al. |
| 2015/0035036 A1 | 2/2015 | Konno et al. |
| 2015/0060992 A1 | 3/2015 | Taekyung et al. |
| 2015/0109862 A1 | 4/2015 | Shibata et al. |
| 2015/0200199 A1 | 7/2015 | Sakamoto et al. |
| 2016/0071763 A1 | 3/2016 | Sho |
| 2016/0190147 A1 | 6/2016 | Kato et al. |
| 2016/0322373 A1 | 11/2016 | Sakamoto et al. |
| 2017/0012050 A1* | 1/2017 | Kato ..................... H01L 23/528 |

FOREIGN PATENT DOCUMENTS

| | | |
|---|---|---|
| JP | 2015-12296 A | 1/2015 |
| JP | 2015-28982 A | 2/2015 |
| JP | 2015-50466 A | 3/2015 |
| JP | 2015-79862 A | 4/2015 |
| WO | WO 2016/135849 A1 | 9/2016 |
| WO | WO 2016/139727 A1 | 9/2016 |
| WO | WO 2016/178263 A1 | 11/2016 |

\* cited by examiner

FIG. 4A
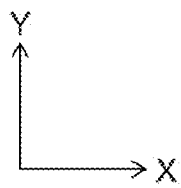
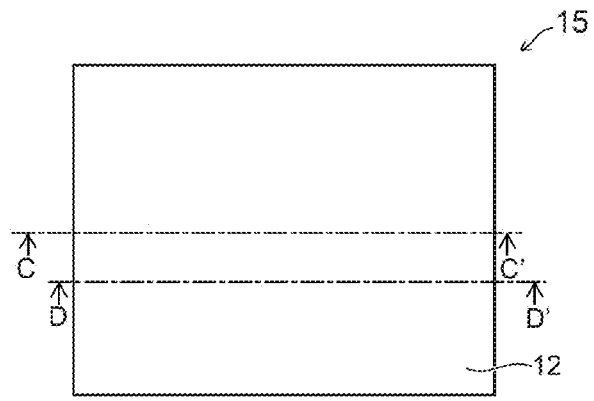
FIG. 4B
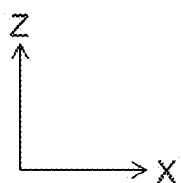
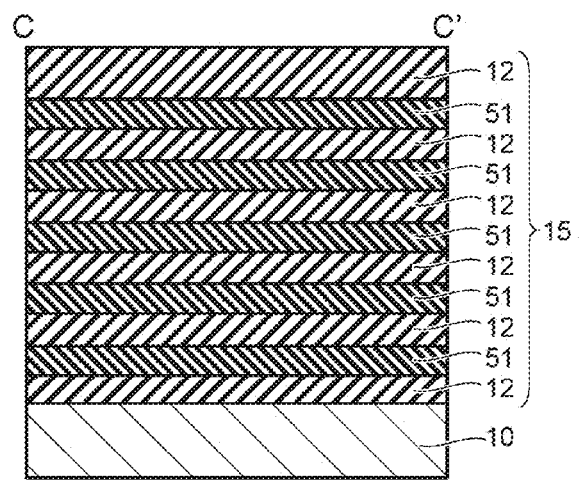
FIG. 4C
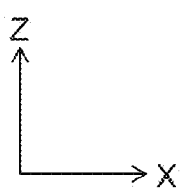
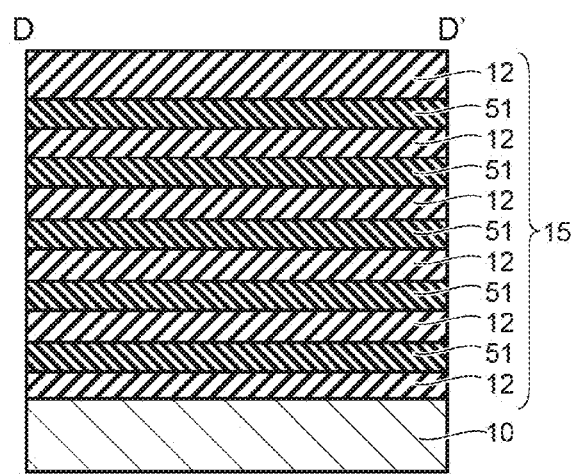

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/307,848, filed on Mar. 14, 2016; the entire contents of which are incorporated herein by reference.

FIELD

Embodiments relate to a semiconductor memory device and a method for manufacturing the same.

BACKGROUND

A stacked type semiconductor memory device in which memory cells are integrated three-dimensionally has recently been proposed. In such a stacked type semiconductor memory device, a stacked body in which electrode films and insulating films are stacked in an alternating manner is provided on a semiconductor substrate, and a semiconductor pillar that passes through the stacked body is provided. A memory cell is formed at each portion where one of the electrode films and the semiconductor pillar intersects. There is demand for a higher degree of integration in such a stacked type semiconductor memory device as well.

BRIEF DESCRIPTION OF THE DRAWINGS

FIGS. 4A to 19C are drawings illustrating a method of manufacturing a semiconductor memory device according to the first embodiment;

DETAILED DESCRIPTION

Figure 1:
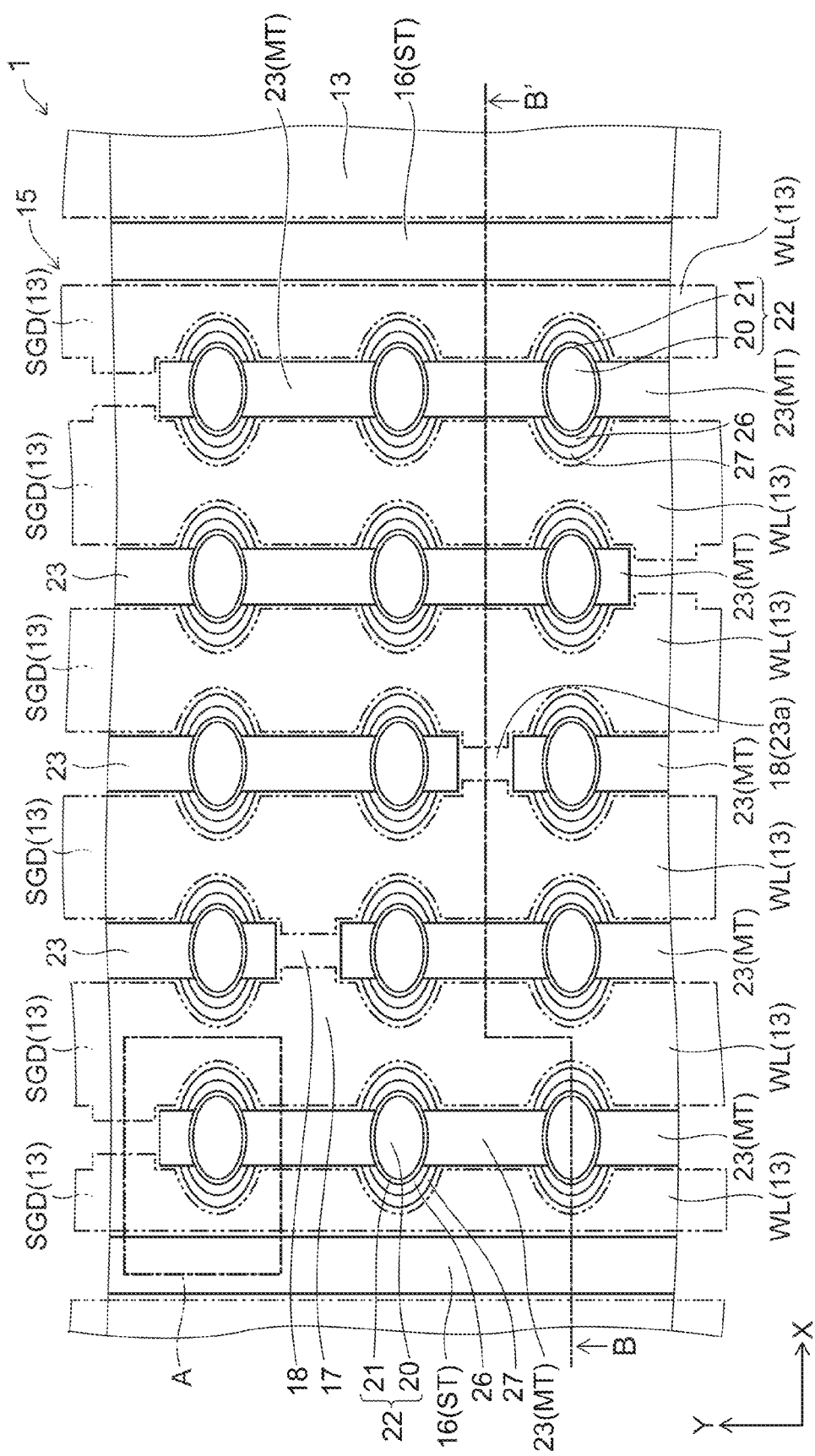
FIG. 1 is a plan view illustrating a semiconductor memory device according to a first embodiment.

A semiconductor memory device according to one embodiment, includes a first electrode film, a plurality of semiconductor members, and a charge storage member. The first electrode film includes three or more first portions and a second portion connecting the first portions to each other. The first portions extend in a first direction and are arranged along a second direction that intersects with the first direction. The plurality of semiconductor members are arranged along the first direction between the first portions and extending in a third direction. The third direction intersects with a plane containing the first direction and the second direction. The charge storage member is disposed between each of the semiconductor members and each of the first portions. The second portion is disposed between the semiconductor members.

A semiconductor memory device according to one embodiment, includes a plurality of first insulating members, a semiconductor member, a second insulating member, and a plurality of electrode films. The plurality of first insulating members are arranged along a first direction and a second direction intersecting with the first direction, and extend in a third direction that intersects with a plane containing the first direction and the second direction. The semiconductor member extends in the third direction, and disposed in a first one of spaces between first insulating members adjacent in the first direction. The second insulating member is disposed in a second one of the spaces. A length of the second insulating member in the second direction is greater than a length of the first insulating member in the second direction. The plurality of electrode films are arranged separated from each other in the third direction. Each of the electrode films includes a plurality of first portions extending in the first direction, and a second portion connecting the plurality of first portions to each other. The first portions are disposed between the first insulating members adjacent in the second direction. The second portion is disposed in a third one of the spaces. The charge storage member is disposed between the semiconductor member and the first portions.

A method for manufacturing a semiconductor memory device, the method includes forming a stacked body by forming a first film and a second film alternately on a substrate. The method includes forming a plurality of first through-sections in the stacked body. The first through-section passes through the stacked body in a first direction in which the first film and the second film are stacked. The first through-section extends in a second direction that intersects with the first direction. The first through-sections are arranged along the second direction and along a third direction that intersects with the first direction and the second direction. The method includes embedding a first insulating member in each of the first through sections. The method includes forming a plurality of second through-sections in the first insulating members. The second through-sections extend in the first direction and arranged in a single row along the second direction. The method includes forming recesses by recessing the second films in inner surfaces of the second through-sections. The method includes forming charge storage members in the recesses. The method includes forming semiconductor members in the second through-sections. The method includes forming a third through-section in the stacked body. The method includes forming spaces between the first films by removing the second films through the third through-section. The method includes forming electrode films within the spaces. The method includes embedding a second insulating member in the third through-section.

First Embodiment

First, a first embodiment will be described.

FIG. 1 is a plan view illustrating a semiconductor memory device according to the embodiment.

Figure 2:
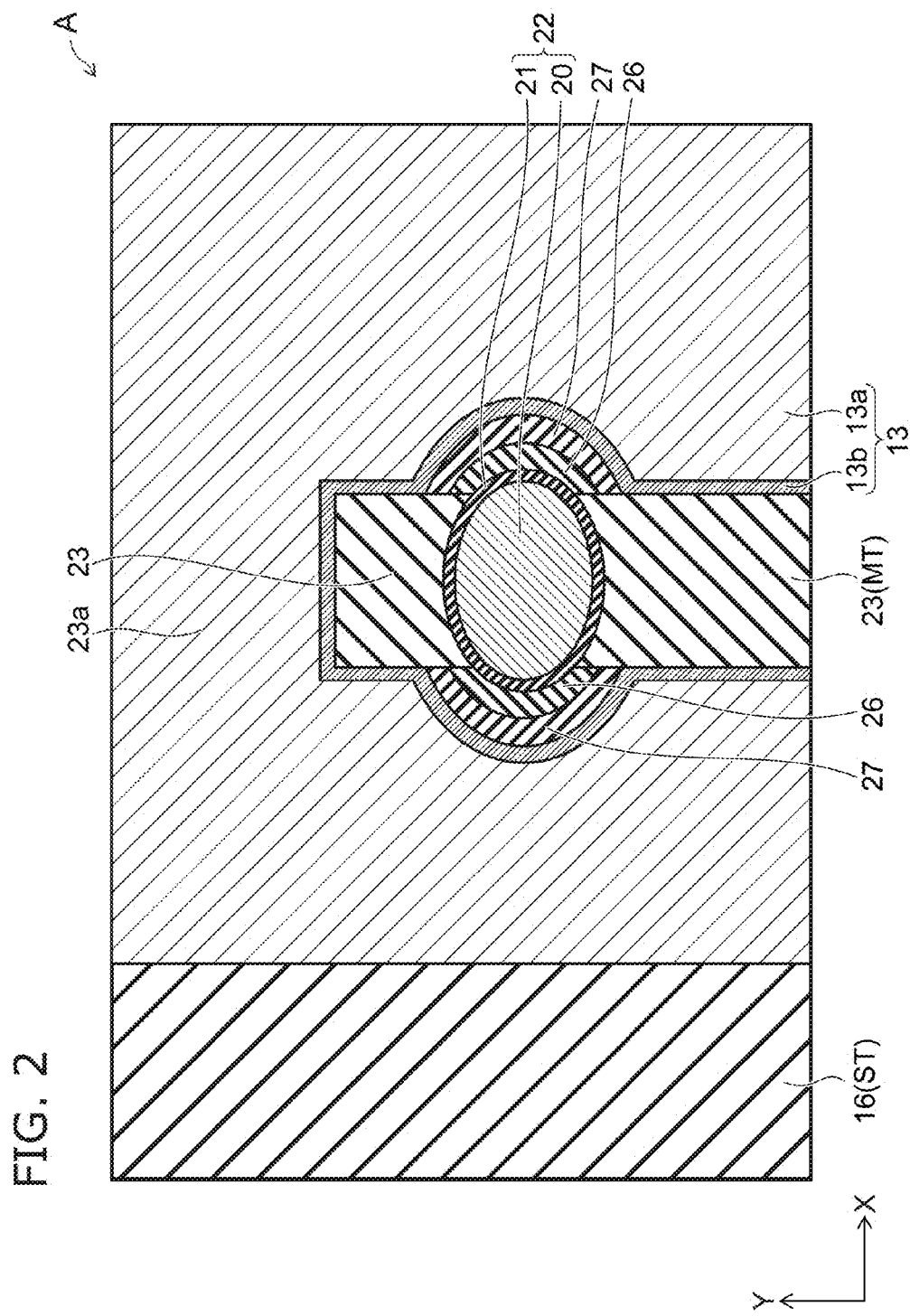
FIG. 2 is a plan view illustrating a region A of FIG. 1.

FIG. 2 is a plan view illustrating a region A of FIG. 1.

Figure 3:
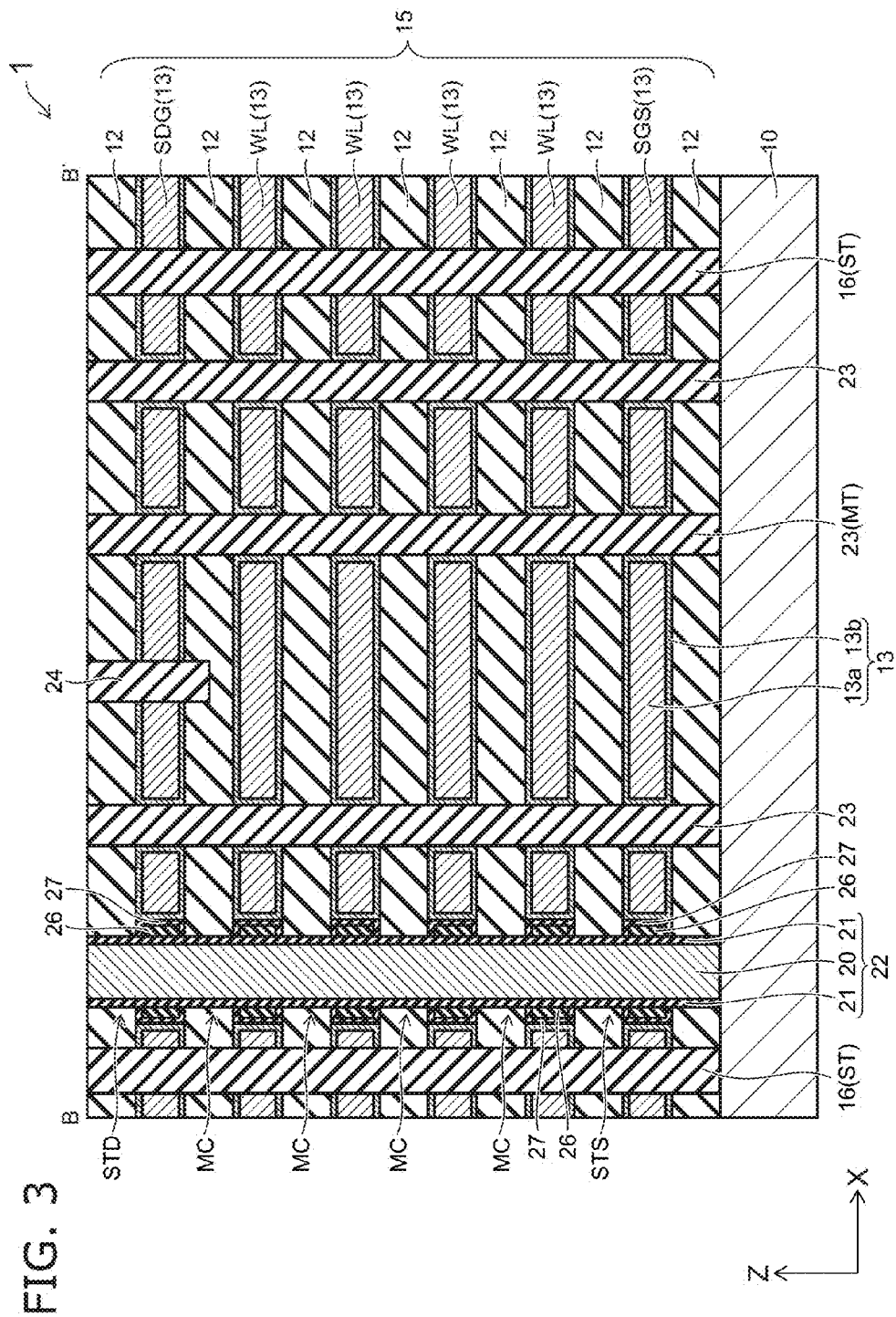
FIG. 3 is a cross-sectional view taken along line B-B' indicated in FIG. 1.

FIG. 3 is a cross-sectional view taken along line B-B' indicated in FIG. 1.

As illustrated in FIGS. 1 to 3, a silicon substrate 10 is provided in a semiconductor memory device 1 according to the embodiment. The silicon substrate 10 is formed from, for example, monocrystalline silicon (Si). A stacked body 15 is provided on the silicon substrate 10.

In the specification, the following XYZ orthogonal coordinate system is used for convenience of explanation. That is, a direction connecting the silicon substrate 10 and the stacked body 15 is defined as a "Z-direction", and two mutually perpendicular directions that are perpendicular to the Z-direction are defined as an "X-direction" and a "Y-direction". In the Z-direction, a direction toward the stacked body 15 from the silicon substrate 10 is also referred to as "up" and the direction opposite thereto is also referred to as "down", but this notation is used only for convenience and is unrelated to the direction of gravity.

In the stacked body 15, insulating films 12 and electrode films 13 are stacked in an alternating manner along the Z-direction. The insulating films 12 are formed from an insulating material such as silicon oxide (SiO), and the electrode films 13 are formed from a conductive material such as a metal material. A plurality of the stacked bodies 15 are provided on the silicon substrate 10, and are arranged along the X-direction so as to be separated from each other. An insulating member 16 is provided between the stacked bodies 15. The insulating member 16 is formed from an insulating material such as silicon oxide, and passes through the stacked bodies 15 in the Z-direction. The shape of the insulating member 16 is a plate-like shape spreading out along an YZ plane that takes the Y-direction as a longitudinal direction.

Silicon pillars 20 extending in the Z-direction are provided in the stacked body 15. The silicon pillars 20 are made from polysilicon, for example, and each has a circular column shape or an elliptical column shape. A bottom end of each silicon pillar 20 is connected to the silicon substrate 10. Note that a core member (not illustrated) made from silicon oxide, for example, may be provided within each silicon pillar 20. The silicon pillars 20 are arranged along two or more rows extending in the Y-direction. The positions of the silicon pillars 20 in the Y-direction may be the same or different from row to row. The embodiment describes an example in which the silicon pillars 20 are arranged cyclically along five rows extending in the Y-direction and the positions of the silicon pillars 20 in the Y-direction are the same from row to row. In other words, in the embodiment, the silicon pillars 20 are arranged along the X-direction and the Y-direction in a matrix.

A tunnel insulating film 21 is provided on a side surface of each silicon pillar 20. The tunnel insulating film 21 is normally an insulating film. However, when a predetermined voltage within the range of a driving voltage of the semiconductor memory device 1 is applied, a tunnel current flows in the tunnel insulating film 21. The tunnel insulating film 21 is, for example, an ONO film formed by stacking a silicon oxide layer, a silicon nitride layer, and a silicon oxide layer in that order. A column 22 is constituted by the silicon pillar 20 and the tunnel insulating film 21.

An insulating member 23 is provided between columns 22 adjacent in the Y-direction. The insulating member 23 passes through the stacked body 15 in the Z-direction. A shape of the insulating member 23 is a substantially rectangular parallelepiped shape that takes the Y-direction as the longitudinal direction. The insulating member 23 is formed from an insulating material such as silicon oxide. A plurality of the insulating members 23 are arranged along the Y-direction so as to be separated from each other, and the column 22 is disposed or a cut 23a is formed between insulating members 23 adjacent in the Y-direction. Part of the stacked body 15 is disposed within the cut 23a. Accordingly, for some of the insulating members 23, one end portion in the Y-direction makes contact with the tunnel insulating film 21 of the column 22 and another end portion terminates at the cut 23a. For the remaining insulating members 23, both end portions in the Y-direction make contact with the tunnel insulating film 21.

An insulating member 24 extending in the Y-direction is provided in an upper portion of the stacked body 15. The insulating member 24 splits one or more of the electrode films 13 located from the top. Accordingly, of the electrode films 13, one or more of the electrode films 13 from the top are split into three or more line-shaped upper select gate lines SGD extending in the Y-direction by the columns 22, the insulating members 23, and the insulating members 24. In the embodiment, one of the electrode films 13 interposed between insulating members 16 is divided into six upper select gate lines SGD arranged along the X-direction.

Meanwhile, the shapes of the electrode films 13 provided below the insulating members 24 are defined by the columns 22 and the insulating members 23. These electrode films 13 are in a web shape, including three or more, for example six, interconnect portions 17 extending in the Y-direction and arranged along the X-direction, and bridge portions 18 extending in the X-direction and connecting the interconnect portions 17 to each other. Of the electrode films 13, one or more of the electrode films 13 from the bottom are lower select gate lines SGS, and the remaining electrode films 13 are word lines WL. The upper select gate lines SGD are disposed in a region immediately above the interconnect portions 17 of the word lines WL. Note that in FIG. 1, the word lines WL are colored gray to make the drawing easier to understand visually. The upper select gate lines SGD are indicated by a double-dot-dash line. The same applies to FIGS. 20 and 21 mentioned later.

Charge storage members 26 are provided between the tunnel insulating film 21 and the electrode films 13. The charge storage members 26 are members capable of accumulating an electric charge, and are formed from a material that includes electron trap sites, such as silicon nitride (SiN). Viewed from the column 22, the charge storage members 26 are provided on both sides in the X-direction, and are provided on neither side in the Y-direction. Accordingly, the charge storage members 26 disposed on both sides of a single column 22 in the X-direction are isolated from each other. Each charge storage member 26 has a semi-ring shape that extends partway around the side surface of the column 22.

Block insulating films 27 are provided between the charge storage members 26 and the electrode films 13. The block insulating film 27 is a film through which a current substantially does not flow even when a voltage within the range of the driving voltage of the semiconductor memory device 1 is applied. The block insulating film 27 is, for example, a dual-layer film in which a silicon oxide layer and an aluminum oxide layer are stacked in that order from the charge storage member 26 side.

In each electrode film 13, a main body portion 13a made from tungsten (W), for example, is provided, and a barrier metal layer 13b made from titanium (Ti), titanium nitride (TiN), or tungsten nitride (WN), for example, is provided on part of the surface of the main body portion 13a. The barrier metal layer 13b is disposed between the main body portion 13a and the block insulating film 27 and between the main body portion 13a and the insulating member 23, and is disposed neither between the main body portion 13a and the insulating member 16 nor between the main body portion 13a and the insulating member 24.

An upper portion interconnect (not illustrated) is provided on the stacked body 15. The upper portion interconnect includes bit lines that extend in the X-direction and are connected to the silicon pillars 20 through plugs (not illustrated).

An upper select gate transistor STD is formed at each portion where an upper select gate line SGD and a silicon pillar 20 intersect. A lower select gate transistor STS is formed at each portion where a lower select gate line SGS and a silicon pillar 20 intersect. A memory cell transistor MC is formed at each portion where a word line WL and a silicon pillar 20 intersect. Accordingly, a plurality of the memory cell transistors MC are connected in series along each silicon pillar 20, and the lower select gate transistor STS and the upper select gate transistor STD are connected to the respective ends thereof, forming a NAND string.

Next, a method of manufacturing the semiconductor memory device according to the embodiment will be described.

FIGS. 4A to 19C are drawings illustrating the method of manufacturing the semiconductor memory device according to the embodiment.

FIG. 4A is a plan view, FIG. 4B is a cross-sectional view taken along line C-C indicated in FIG. 4A, and FIG. 4C is a cross-sectional view taken along line D-D' indicated in FIG. 4A. The same applies to FIGS. 5A to 19C.

First, as illustrated in FIGS. 4A to 4C, the stacked body 15 is formed by forming the insulating films 12 and sacrificial films 51 in an alternating manner on the silicon substrate 10. The insulating films 12 are formed by depositing silicon oxide using a chemical vapor deposition (CVD), for example, and the sacrificial films 51 are formed by depositing silicon nitride using the CVD, for example.

Figure 5A:
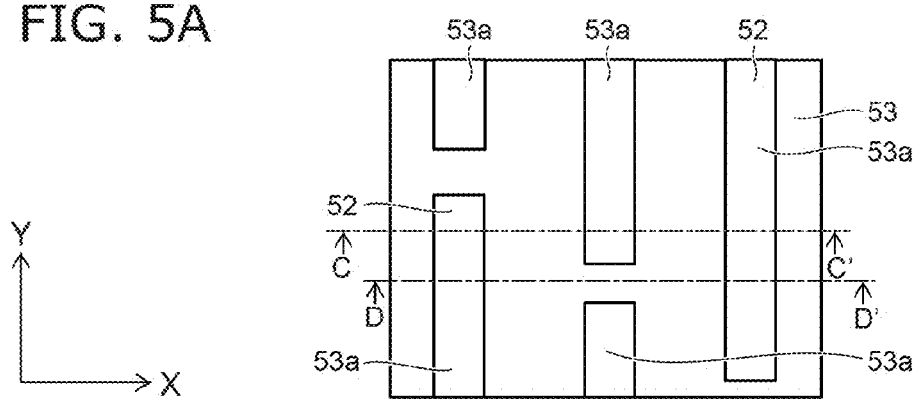
Figure 5B:
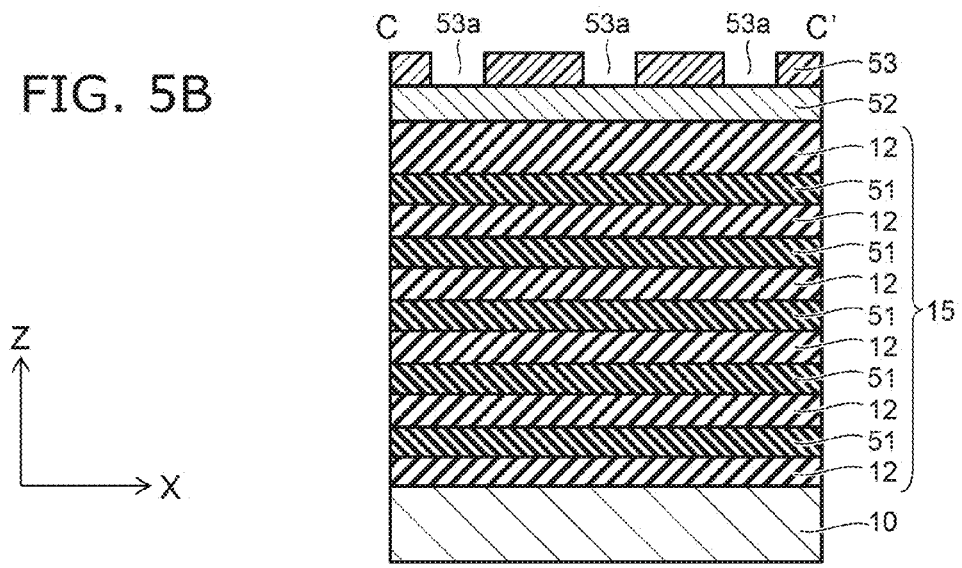
Figure 5C:
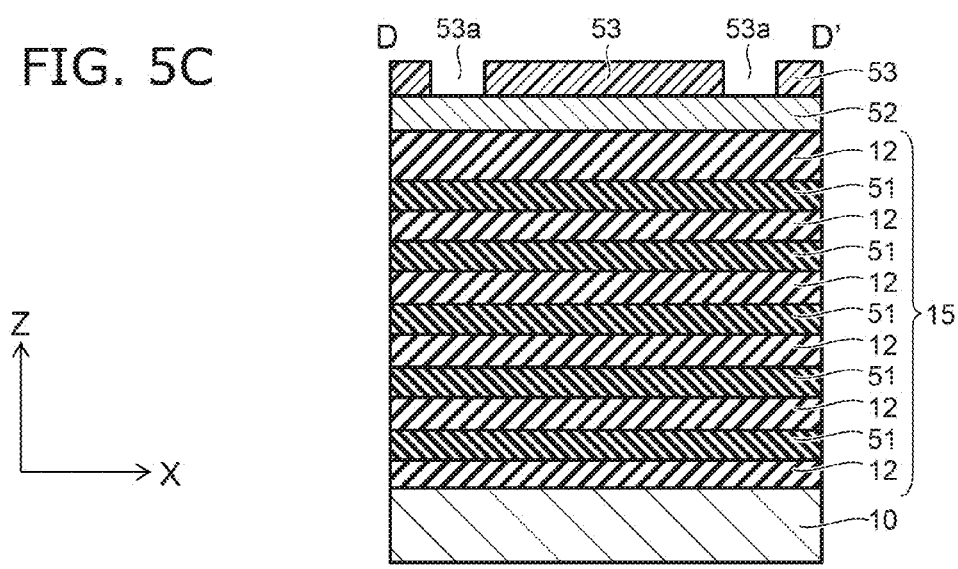

Next, as illustrated in FIGS. 5A to 5C, an antireflective film 52 is formed on the stacked body 15, and a resist film is formed on the antireflective film 52. Next, the resist film is patterned using the lithography method to form a resist mask 53. A plurality of openings 53a are formed in the resist mask 53. Viewed from the Z-direction, each opening 53a is rectangular in shape, and a length thereof in the Y-direction is greater than a length thereof in the X-direction. The plurality of openings 53a are arranged so as to form two or more rows, for example five rows, extending in the Y-direction. In each row, two or more of the openings 53a are arranged so as to be separated from each other.

Figure 6A:
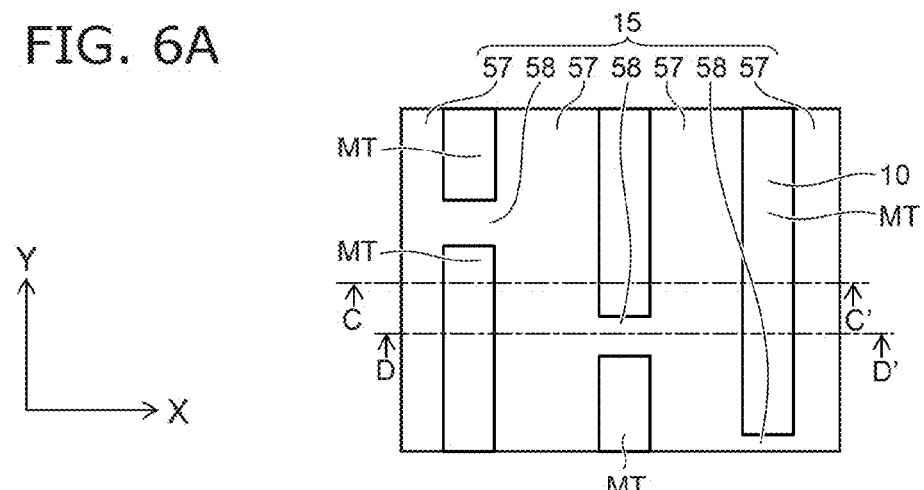
Figure 6B:
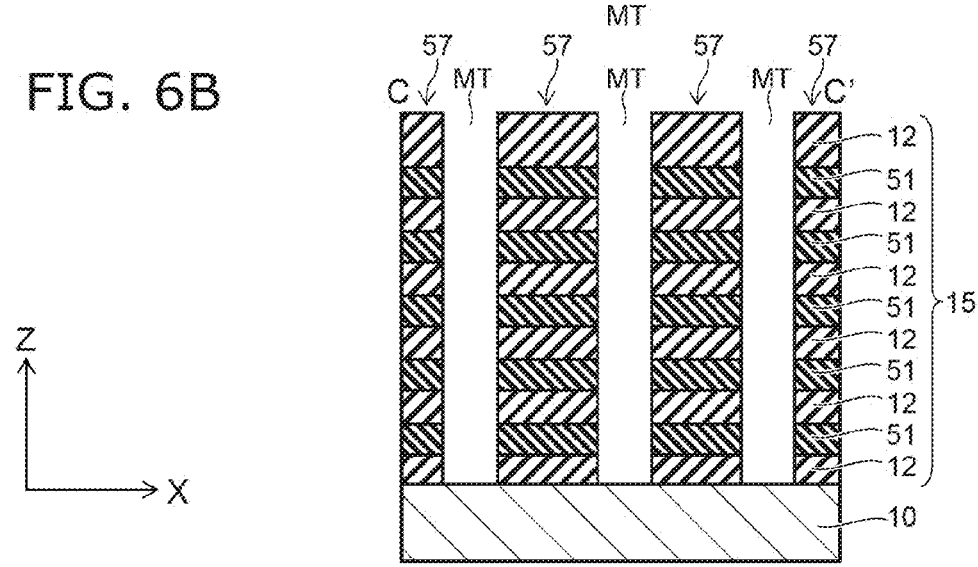
Figure 6C:
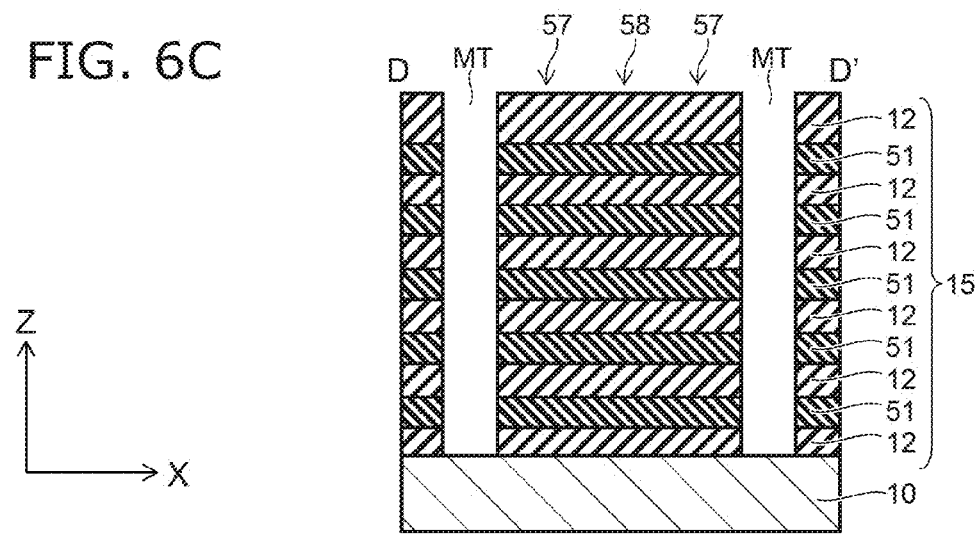

Next, as illustrated in FIGS. 6A to 6C, the antireflective film 52 (see FIGS. 5A to 5C) and the stacked body 15 are selectively removed by carrying out anisotropic etching such as reactive ion etching (RIE) using the resist mask 53 (see FIGS. 5A to 5C) as a mask. A plurality of memory trenches MT are formed in the stacked body 15 as a result. The silicon substrate 10 is exposed at bottom faces of the memory trenches MT. The resist mask 53 and the antireflective film 52 are then removed.

The memory trenches MT are formed in regions immediately below the openings 53a in the resist mask 53. Accordingly, viewed from the Z-direction, each memory trench MT is rectangular in shape, and a length thereof in the Y-direction is greater than a length thereof in the X-direction. The plurality of memory trenches MT are arranged so as to form three or more rows, for example five rows, extending in the Y-direction. In each row of the memory trenches MT, two or more memory trenches MT are arranged so as to be separated from each other. As a result, the stacked body 15 is processed into a web shape including line-shaped portions 57 that are disposed between memory trenches MT adjacent in the X-direction and that extend in the Y-direction, and bridge portions 58 that are disposed between memory trenches MT adjacent in the Y-direction and that connect the line-shaped portions 57 to each other. The presence of the bridge portions 58 makes it possible to prevent the line-shaped portions 57 from deforming or collapsing.

Figure 7A:
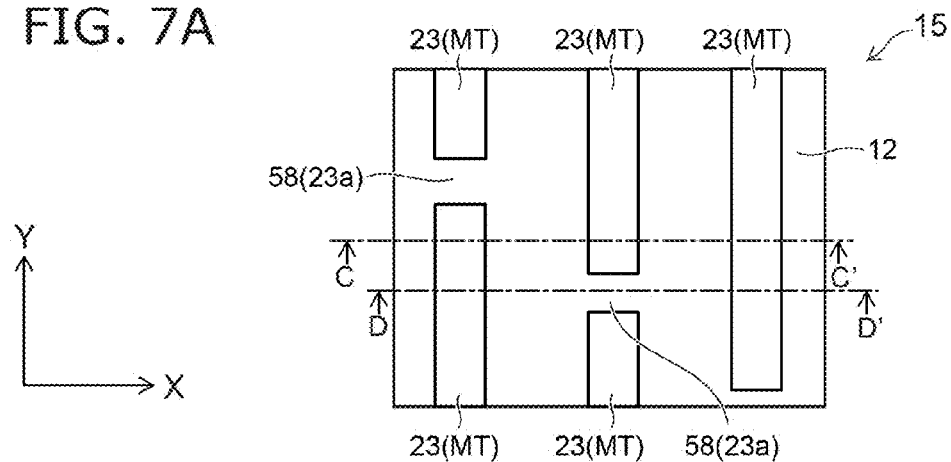
Figure 7B:
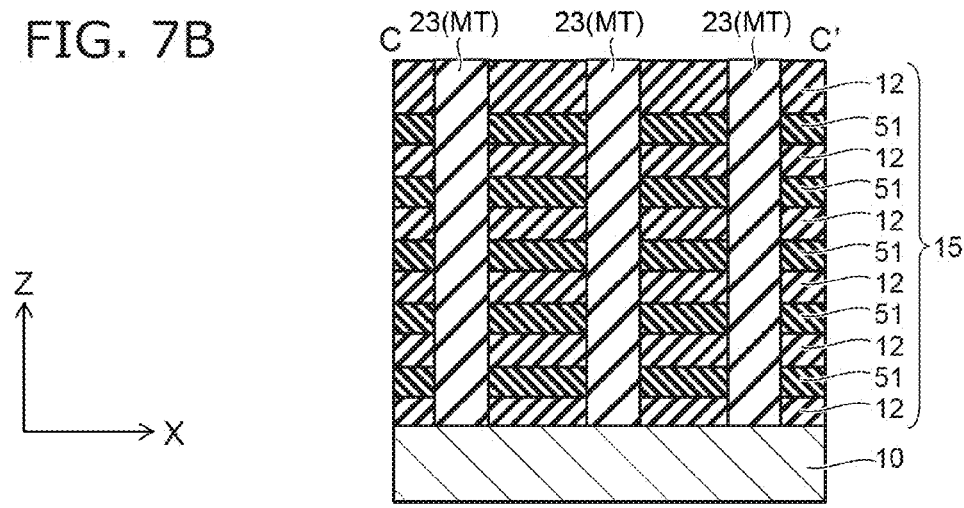
Figure 7C:
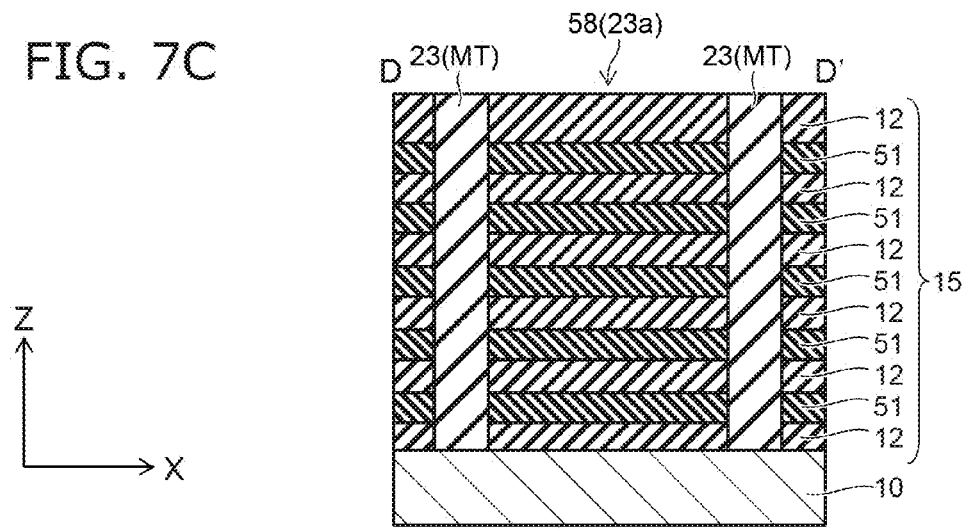

Next, as illustrated in FIGS. 7A to 7C, polysilazane is applied to the entire surface. Next, annealing is carried out to fire the polysilazane and transform the polysilazane into silicon oxide. Next, the silicon oxide deposited on the top surface of the stacked body 15 is removed by carrying out a flattening process such as chemical mechanical polishing (CMP). The insulating members 23 made of silicon oxide are formed in the memory trenches MT as a result. The insulating members 23 are arranged so as to form three or more rows, for example five rows, extending in the Y-direction. The portions of the stacked body 15 corresponding to the bridge portions 58 serve as the cuts 23a in the insulating members 23.

Because the memory trenches MT are divided by the line-shaped portions 57 and the bridge portions 58 of the stacked body 15, each memory trench MT has a low volume. Accordingly, even if the insulating members 23 are formed from silicon oxide by firing polysilazane, only a small amount of polysilazane has been deposited in the memory trenches MT. Therefore, the volume of the polysilazane will only change by a small amount. This also places little stress on the stacked body 15.

Figure 8A:
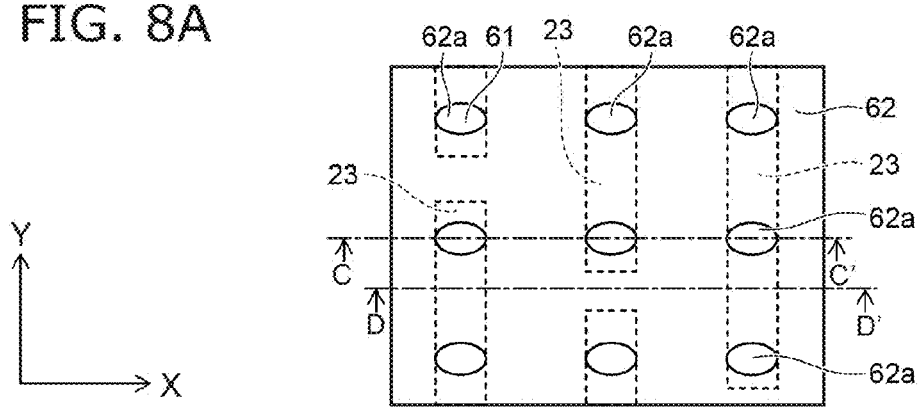
Figure 8B:
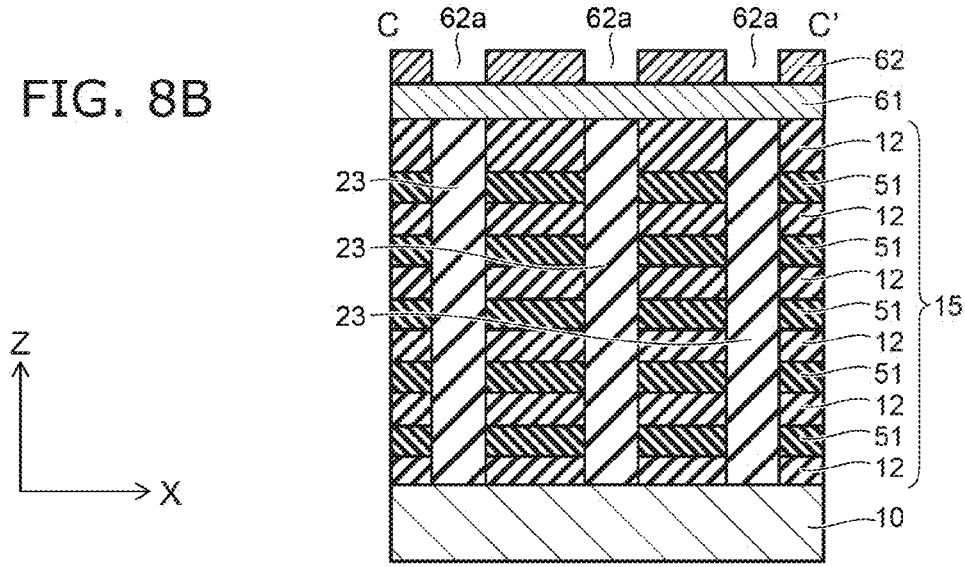
Figure 8C:
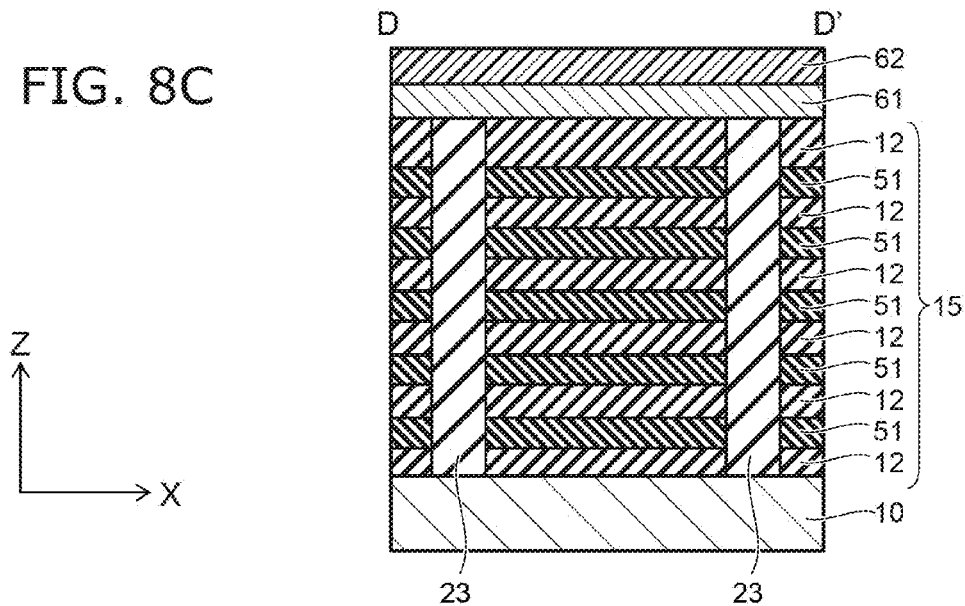

Next, as illustrated in FIGS. 8A to 8C, an antireflective film 61 is formed on the stacked body 15, and a resist film is formed on the antireflective film 61. Next, the resist film is patterned using the lithography method to form a resist mask 62. A plurality of openings 62a are formed in the resist mask 62. The openings 62a are arranged in a single row along the Y-direction, in regions directly above corresponding insulating members 23. Viewed from the Z-direction, the shape of each opening 62a is a circle or an ellipse that takes the X-direction as a longitudinal diameter direction.

Figure 9A:
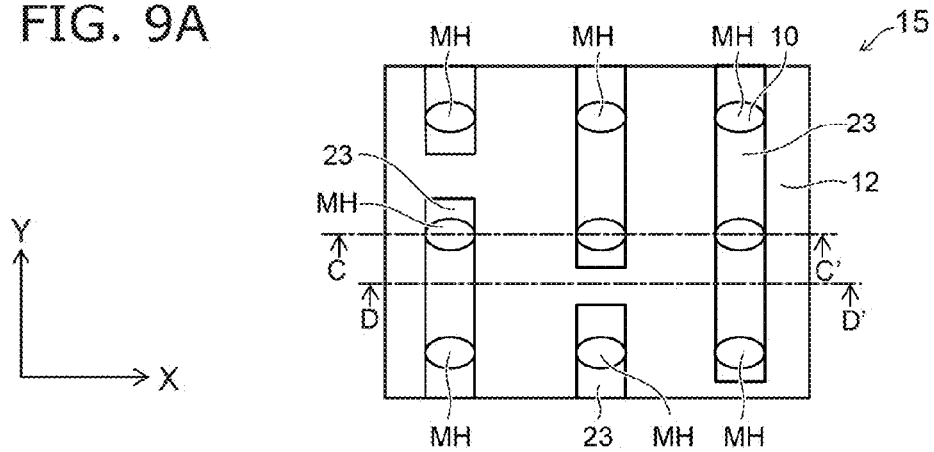
Figure 9B:
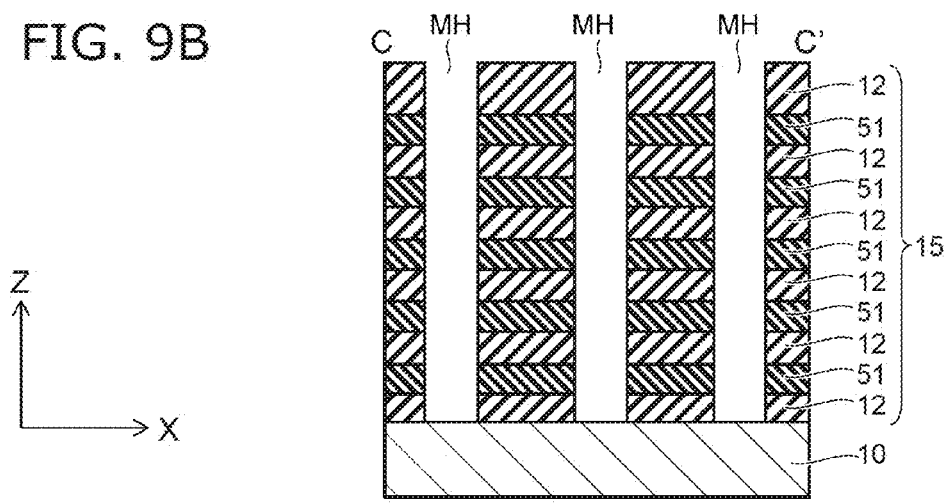
Figure 9C:
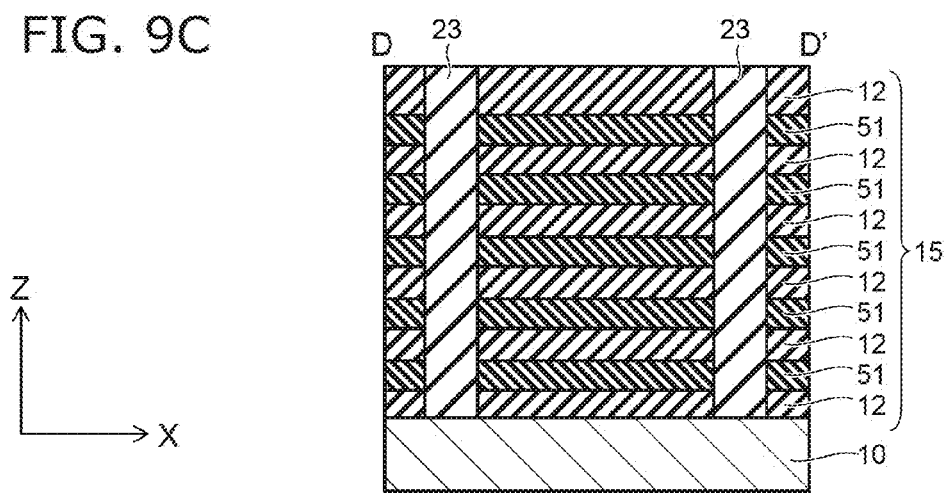

Next, as illustrated in FIGS. 9A to 9C, the antireflective film 61 (see FIGS. 8A to 8C) and the stacked body 15 are selectively removed by carrying out anisotropic etching such as RIE using the resist mask 62 (see FIGS. 8A to 8C) as a mask. A plurality of memory holes MH are formed in the stacked body 15 as a result. The silicon substrate 10 is exposed at bottom faces of the memory holes MH. The resist mask 62 and the antireflective film 61 are then removed.

The memory holes MH are formed in regions immediately below the openings 62a in the resist mask 62 (see FIGS. 8A to 8C). Accordingly, viewed from the Z-direction, the shape of each memory hole MH is a circle or an ellipse. Additionally, the memory holes MH are formed in the insulating members 23 so as to split the insulating members 23, and are arranged in a single row along the Y-direction in each insulating member 23.

Figure 10A:
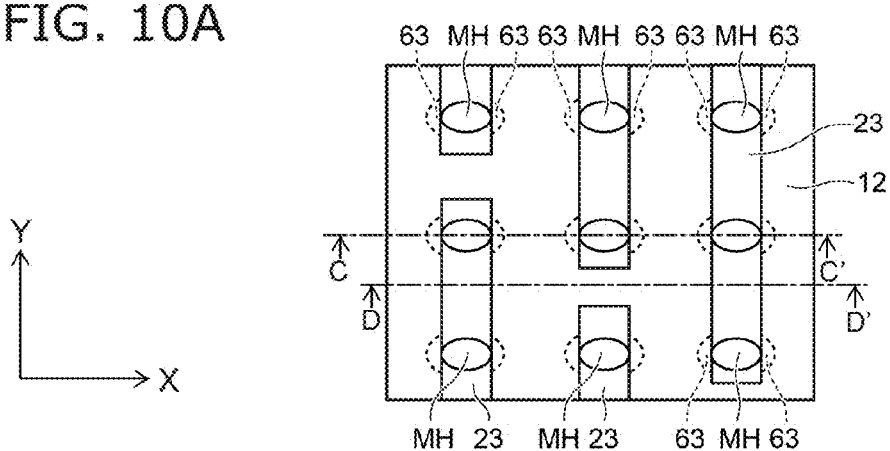
Figure 10B:
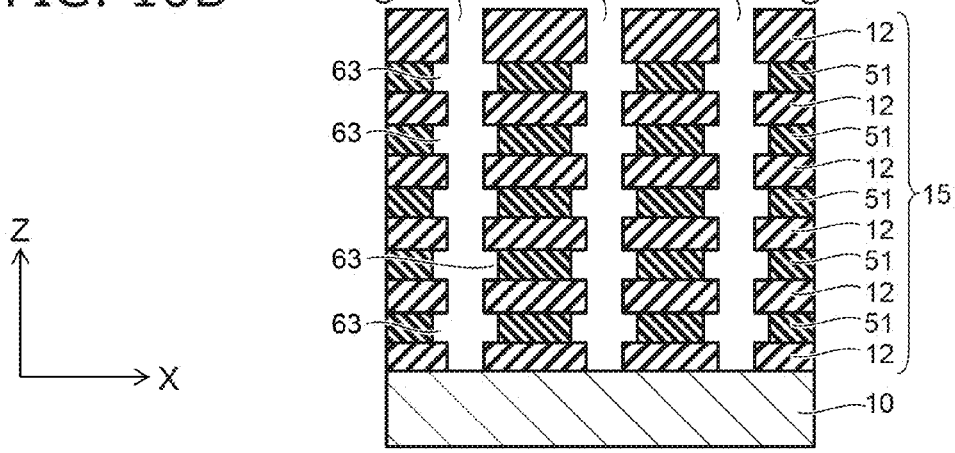
Figure 10C:
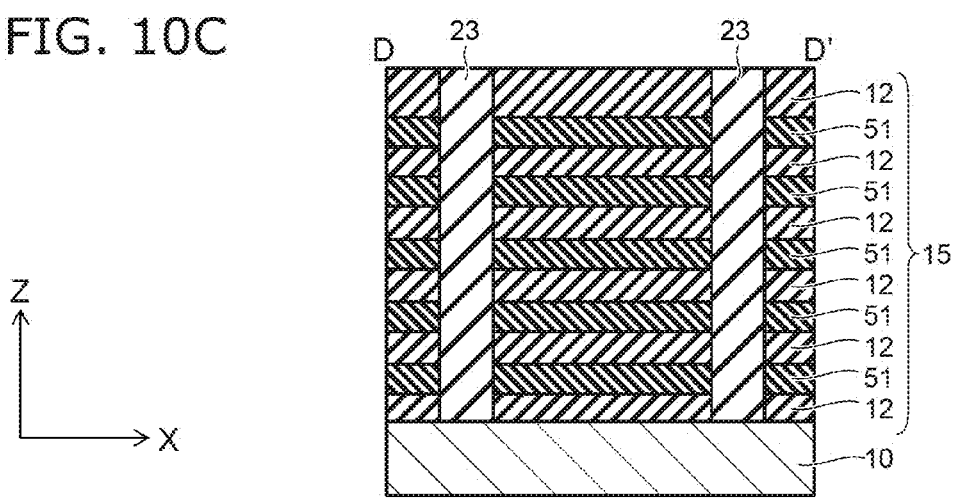

Next, as illustrated in FIGS. 10A to 10C, the sacrificial films 51 made from silicon nitride are etched through the memory holes MH. As a result, the surfaces of the sacrificial films 51 exposed on the inner surfaces of the memory holes MH are recessed so as to form recesses 63. The recesses 63 are formed on both sides of the memory holes MH in the X-direction, and the shape of each recess 63 is a semi-ring shape.

Figure 11A:
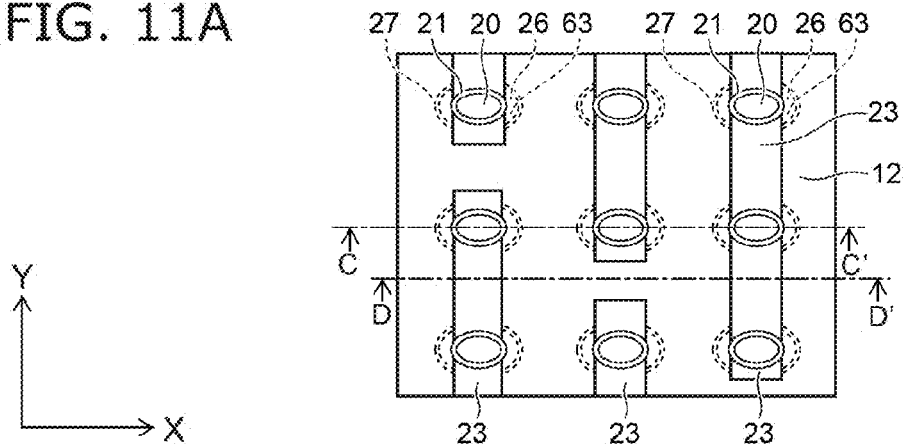
Figure 11B:
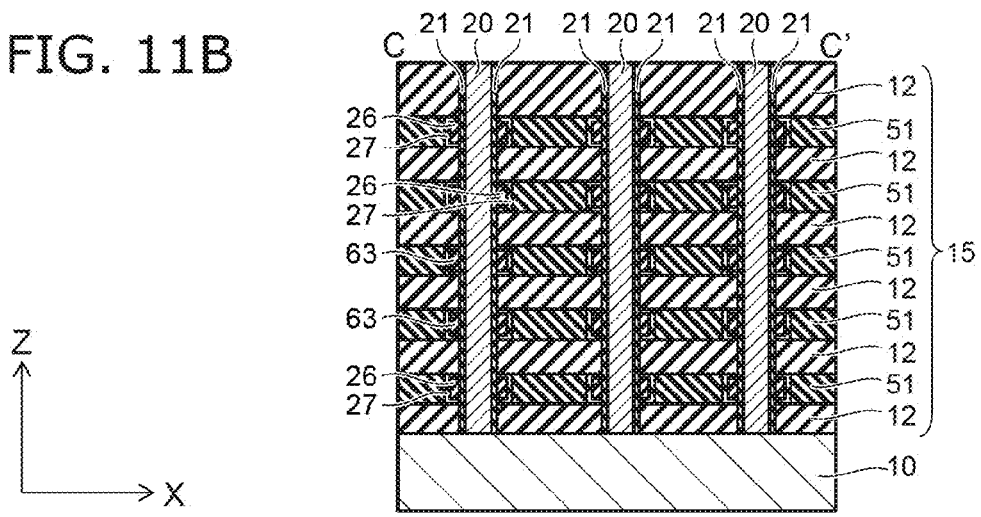
Figure 11C:
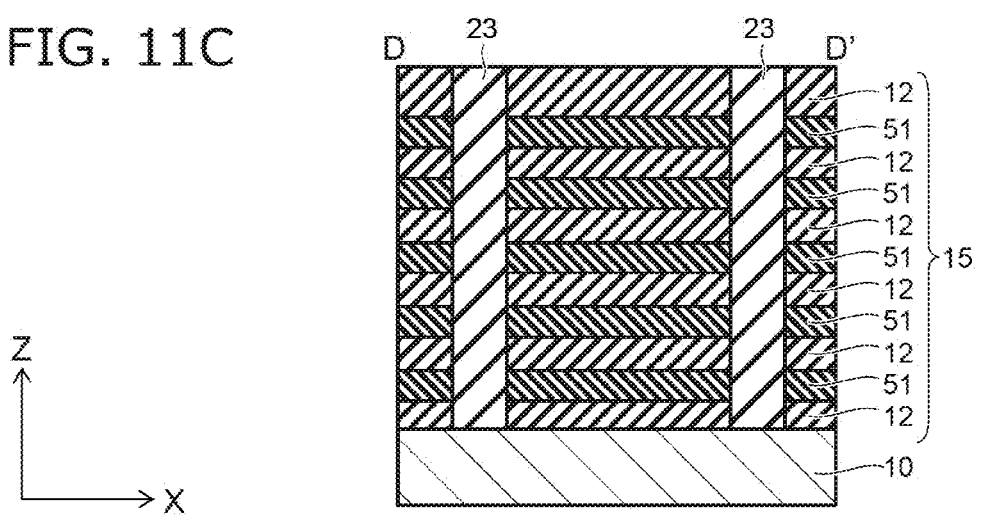

Next, as illustrated in FIGS. 11A to 11C, the block insulating films 27 are formed by forming an aluminum oxide layer and a silicon oxide layer on the inner surfaces of the memory holes MH and the recesses 63. Next, the charge storage members 26 are formed by depositing silicon nitride on the surfaces of the block insulating films 27.

Next, the portions of the charge storage members 26 and the block insulating films 27 formed outside of the recesses 63 are removed by carrying out wet etching or isotropic etching such as chemical dry etching (CDE) through the memory holes MH. The charge storage members 26 and the block insulating films 27 are split from recess 63 to recess 63. Next, the tunnel insulating film 21 is formed on the inner surfaces of each memory hole MH by forming a silicon oxide layer, a silicon nitride layer, and a silicon oxide layer in that order. Next, the silicon pillars 20 are formed by embedding silicon in the memory holes MH.

Figure 12A:
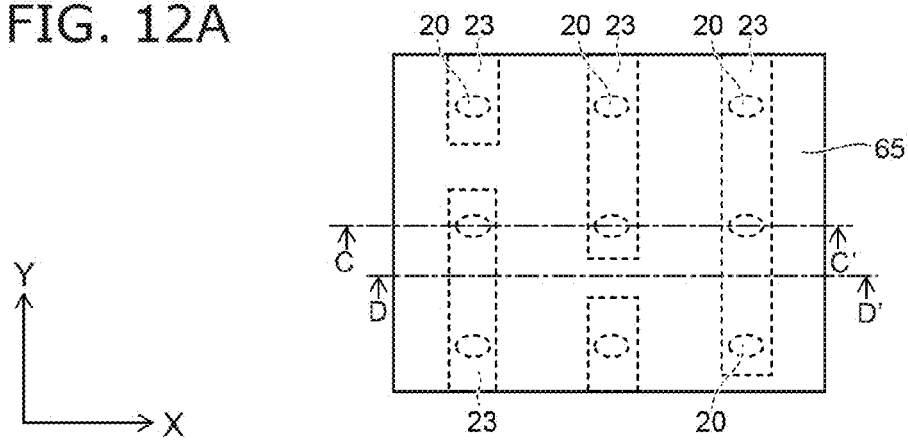
Figure 12B:
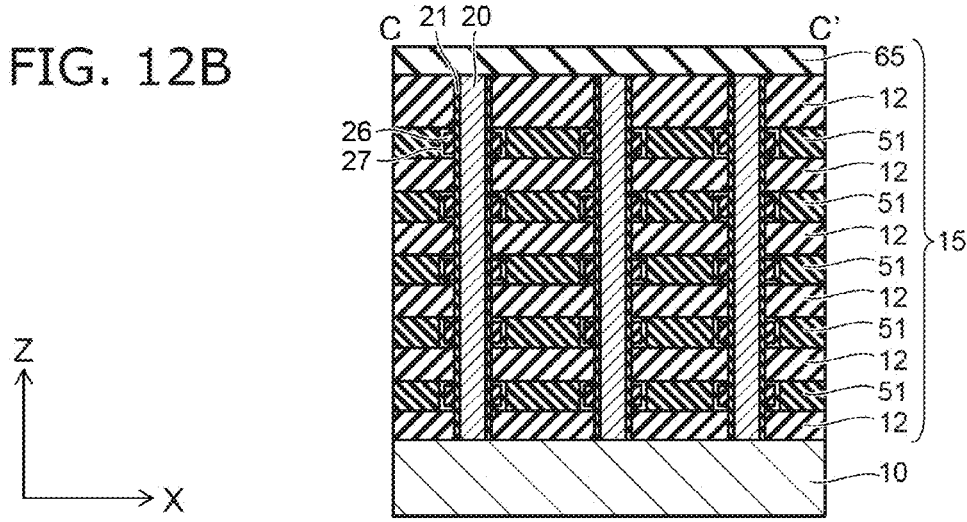
Figure 12C:
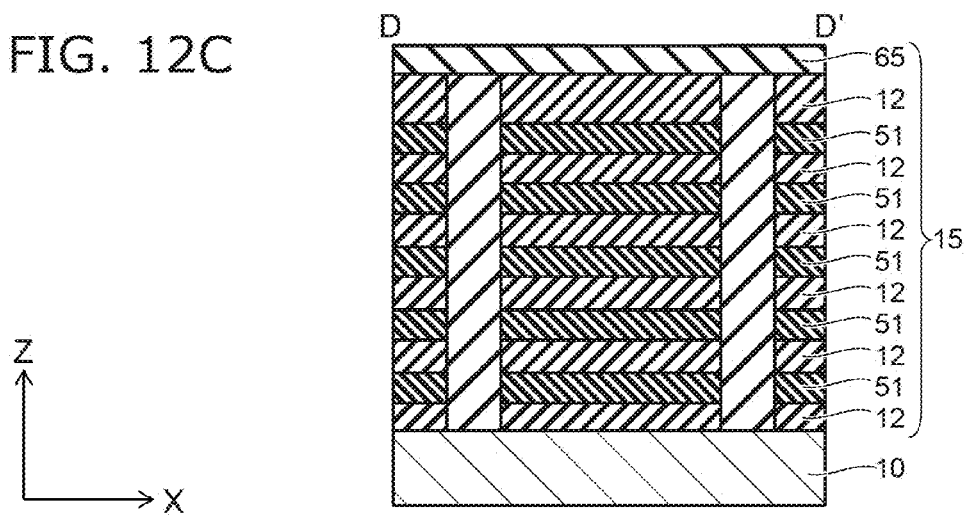

Next, as illustrated in FIGS. 12A to 12C, an insulating film 65 is formed by depositing silicon oxide on the stacked body 15. The insulating film 65 makes contact with the topmost insulating film 12. The insulating film 65 will be described as part of the stacked body 15 hereinafter.

Figure 13A:
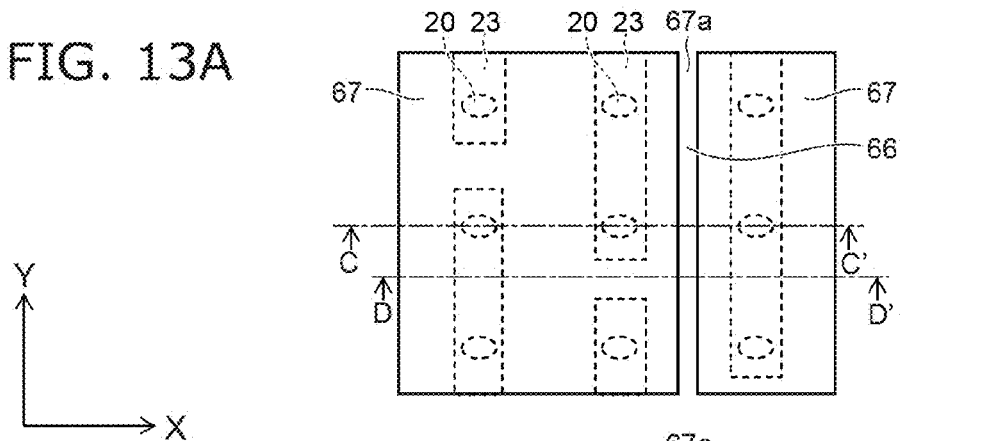
Figure 13B:
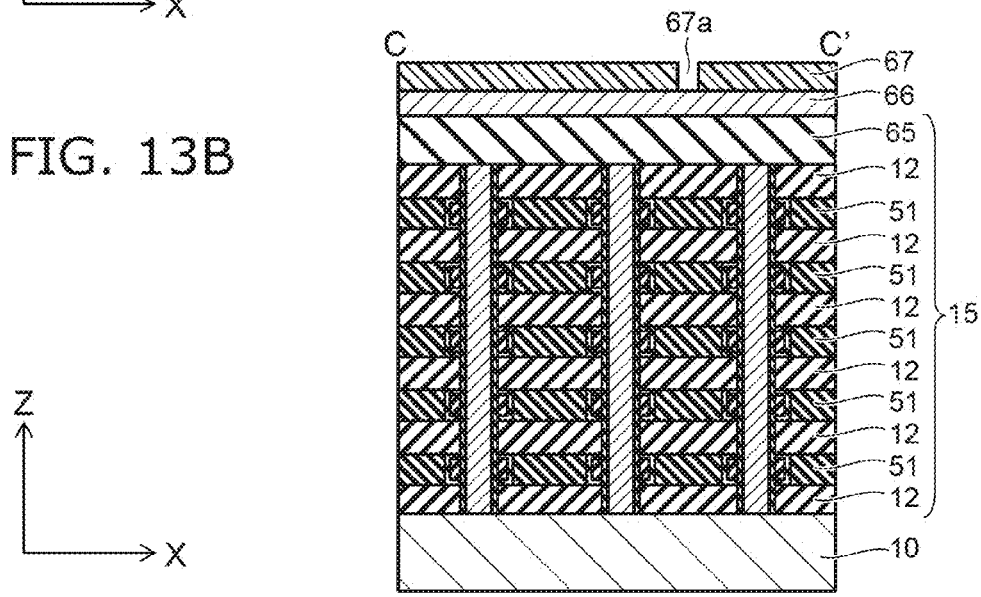
Figure 13C:
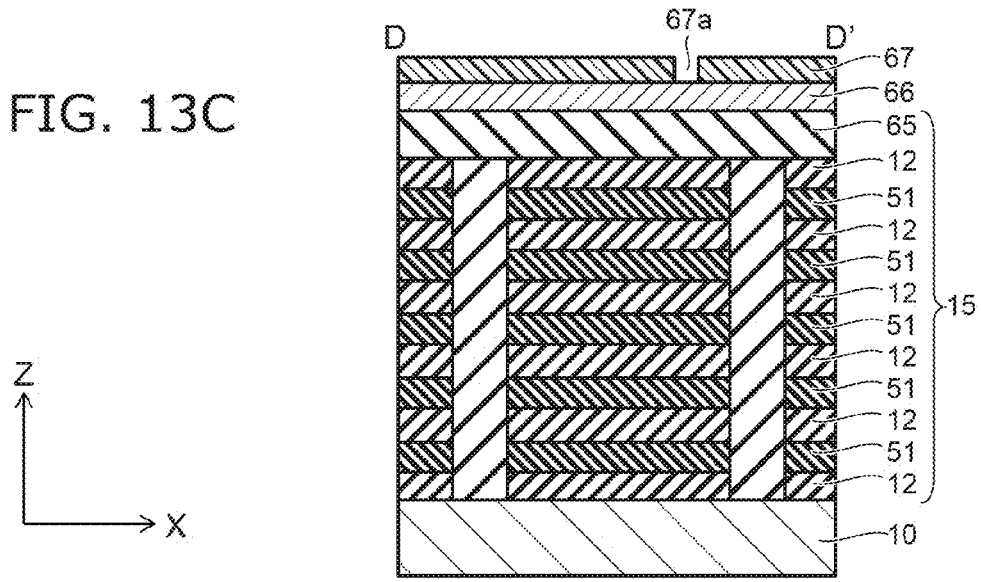

Next, as illustrated in FIGS. 13A to 13C, an antireflective film 66 and a resist film are formed on the insulating film 65. Next, the resist film is patterned using the lithography method to form a resist mask 67. A line-shaped opening 67a extending in the Y-direction is formed in the resist mask 67. Viewed from the Z-direction, the opening 67a is formed on respective sides in the X-direction of the plurality of insulating members 23 arranged in five rows extending in the Y-direction.

Figure 14A:
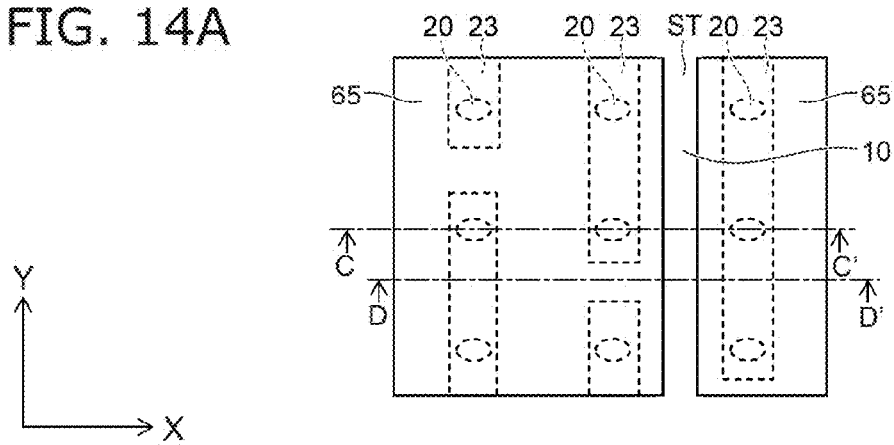
Figure 14B:
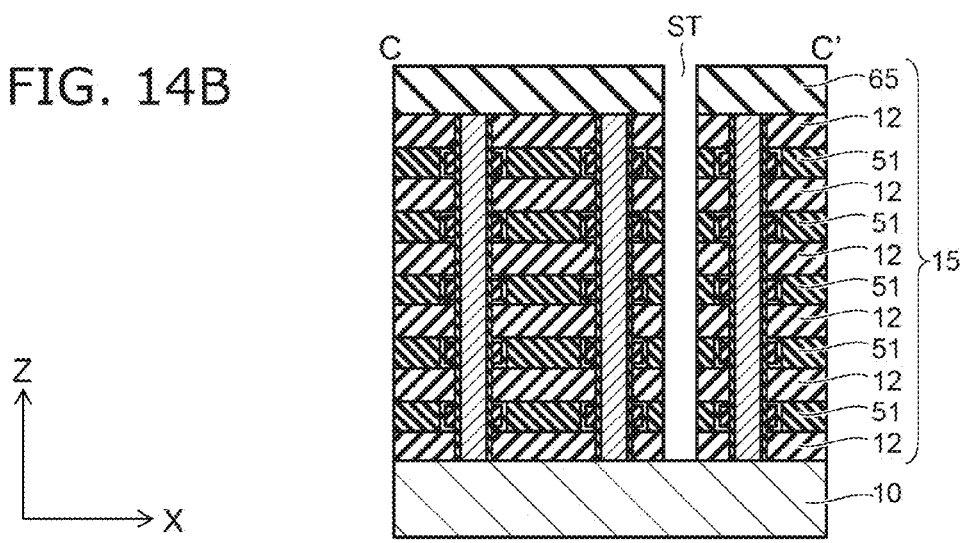
Figure 14C:
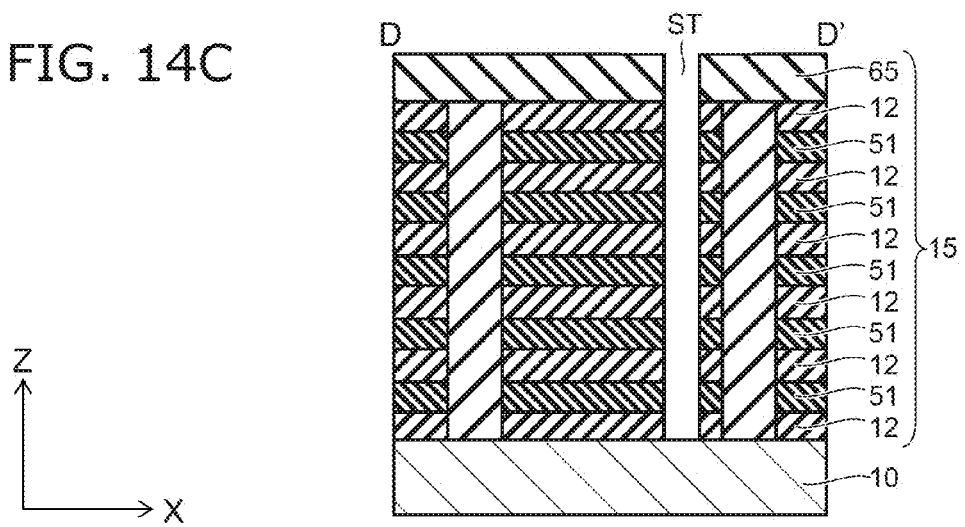

Next, as illustrated in FIGS. 14A to 14C, the antireflective film 66 (see FIGS. 13A to 13C) and the stacked body 15 are selectively removed by carrying out anisotropic etching such as RIE using the resist mask 67 (see FIGS. 13A to 13C) as a mask. A line-shaped slit ST extending in the Y-direction is formed in the stacked body 15 as a result. The slit ST is formed in a region immediately below the opening 67a (see FIGS. 13A to 13C), and thus is formed on respective sides in the X-direction of the plurality of insulating members 23 arranged in five rows extending in the Y-direction. The silicon substrate 10 is exposed at bottom face of the slit ST. The resist mask 67 and the antireflective film 66 are then removed.

Figure 15A:
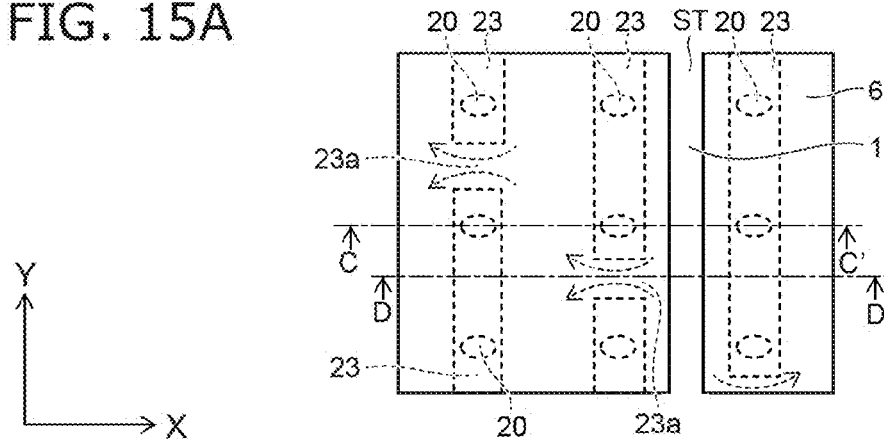
Figure 15B:
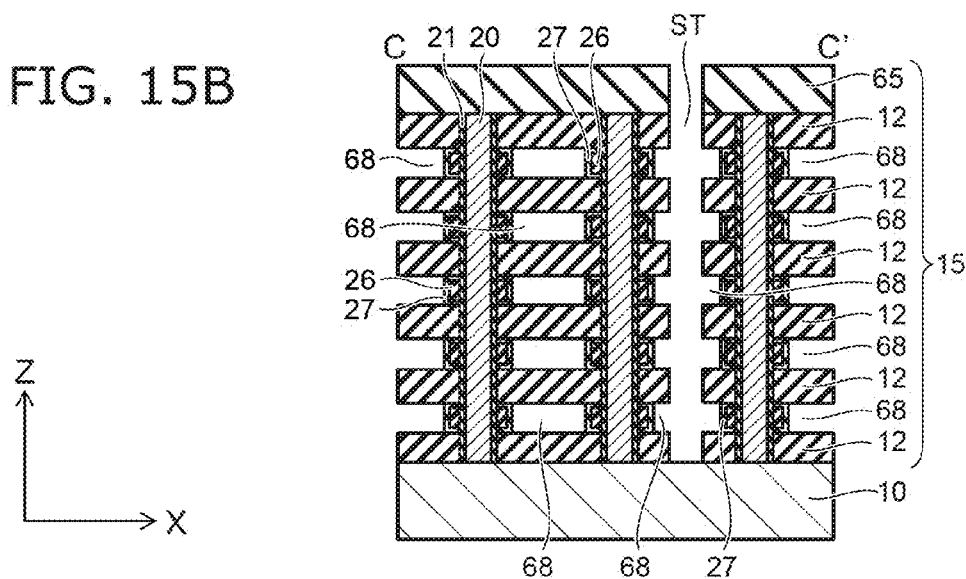
Figure 15C:
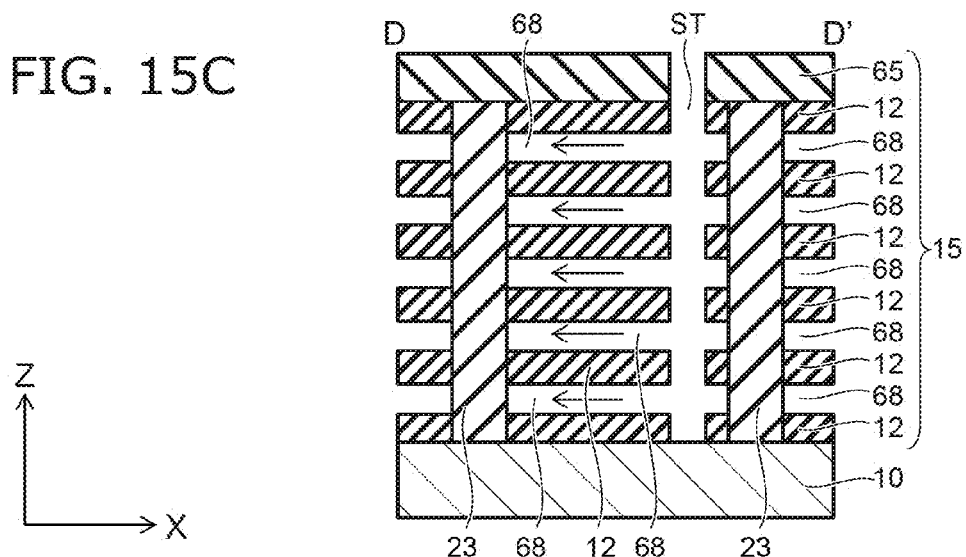

Next, as illustrated in FIGS. 15A to 15C, the sacrificial films 51 (see FIGS. 14B and 14C) are removed by carrying out isotropic etching through the slit ST. For example, wet etching is carried out using hot phosphoric acid. As a result, spaces 68 are formed after the sacrificial films 51 have been removed. The insulating films 12 are exposed on the top and bottom surfaces of the spaces 68, and the block insulating films 27 and the insulating members 23 are exposed on the back surfaces of the spaces 68.

At this time, the sacrificial films 51 at each level are removed and the spaces 68 are formed in the cuts 23a (see FIGS. 1 and 2) in the insulating members 23 as well. The etchant also spreads to regions distanced from the slit ST through the spaces 68 formed in the cuts 23a. As a result, the spaces 68 are also formed in regions opposed to the slit ST with the insulating member 23 interposed therebetween.

Figure 16A:
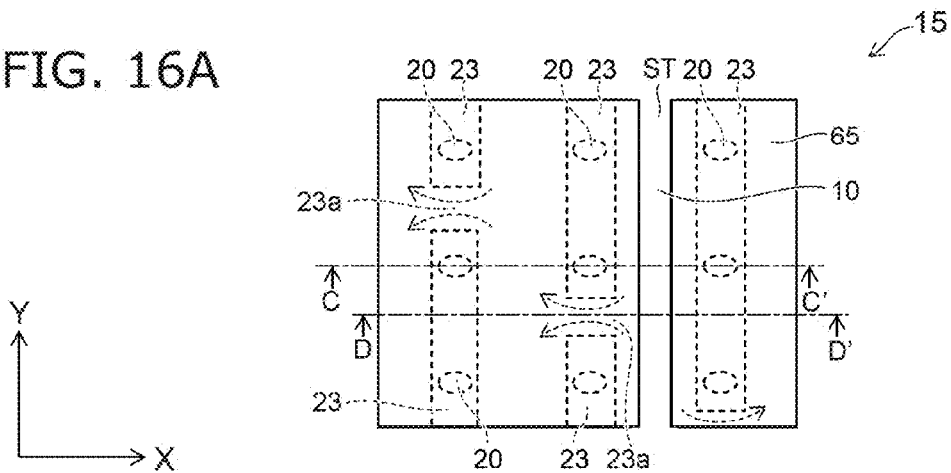
Figure 16B:
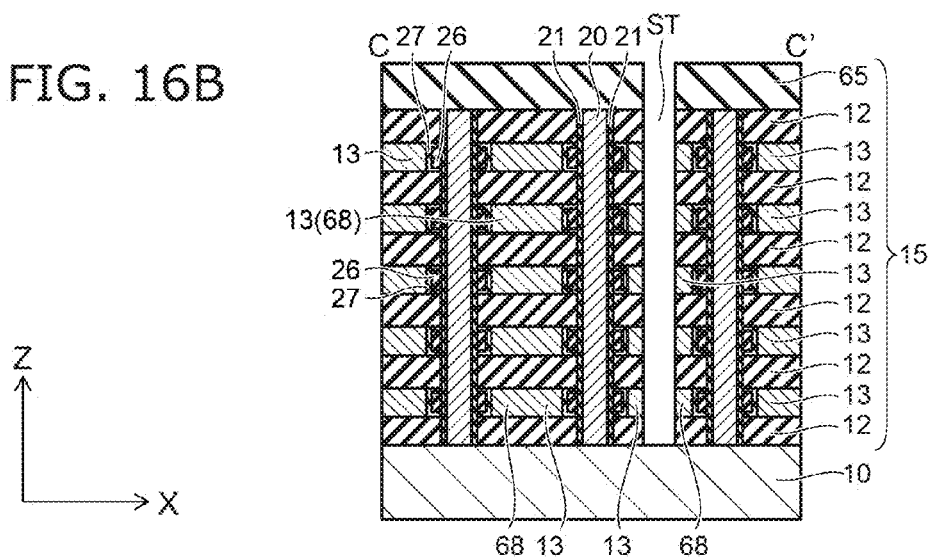
Figure 16C:
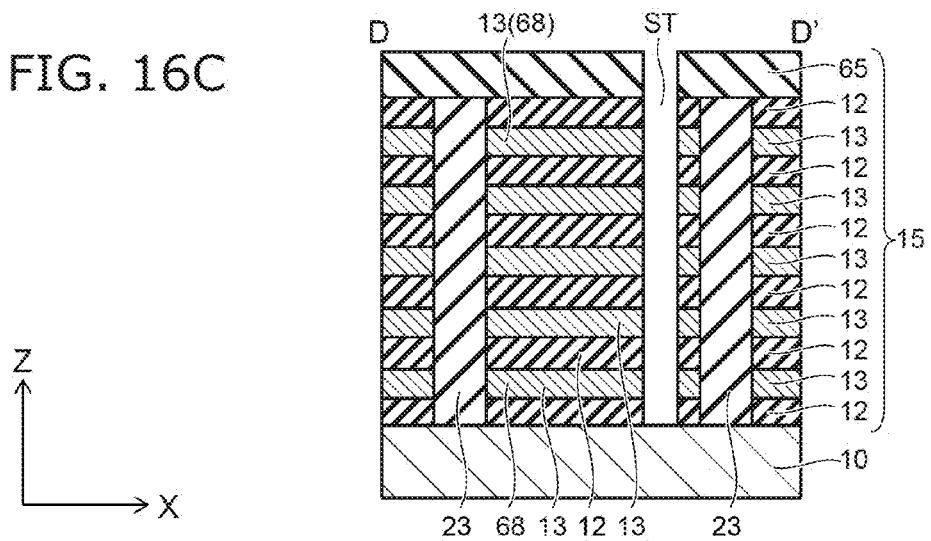

Next, as illustrated in FIGS. 16A to 16C, the barrier metal layers 13b (see FIG. 3) are formed on the inner surfaces of the slit ST and the spaces 68 by depositing titanium, titanium nitride, tungsten nitride, or the like through the slit ST using CVD, for example. The barrier metal layers 13b are formed on the inner surfaces of the slit ST and the spaces 68, or in other words, on the exposed surfaces of the insulating films 12, the block insulating films 27, and the insulating members 23.

Next, the main body portions 13a (see FIG. 3) are formed on the inner surfaces of the slit ST and the spaces 68 by depositing a conductive material such as tungsten through the slit ST using CVD, for example. Each electrode film 13 is formed from the barrier metal layer 13b and the main body portion 13a. The electrode films 13 are formed so that the entire spaces 68 are filled but the slit ST is not completely filled.

At this time, a source gas of the electrode films 13 also spreads to regions distant from the slit ST through the spaces 68 formed in the cuts 23a of the insulating members 23. As a result, the electrode films 13 are also formed in the spaces 68, in parts opposed to the slit ST with the insulating member 23 interposed therebetween.

Next, the portions of the electrode films 13 formed within the slit ST are removed while leaving the portions formed in the spaces 68 by carrying out etching through the slit ST. The electrode films 13 are split from space 68 to space 68 as a result.

Figure 17A:
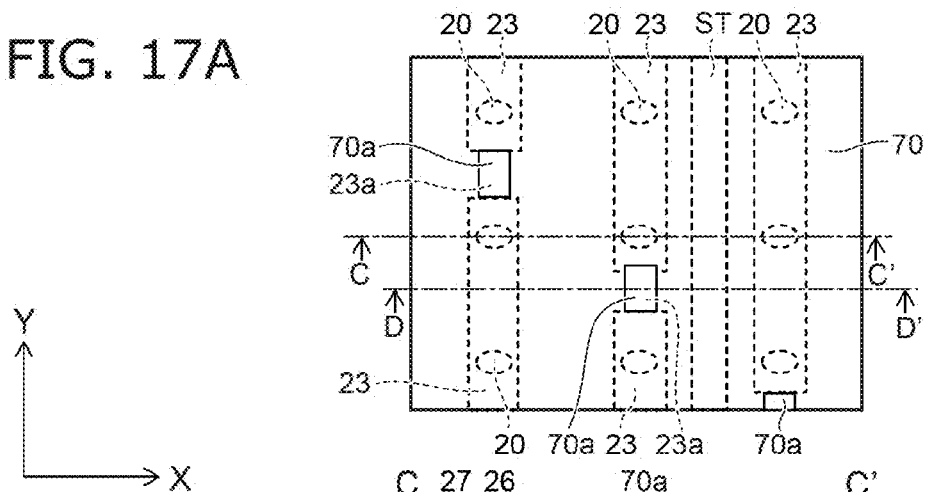
Figure 17B:
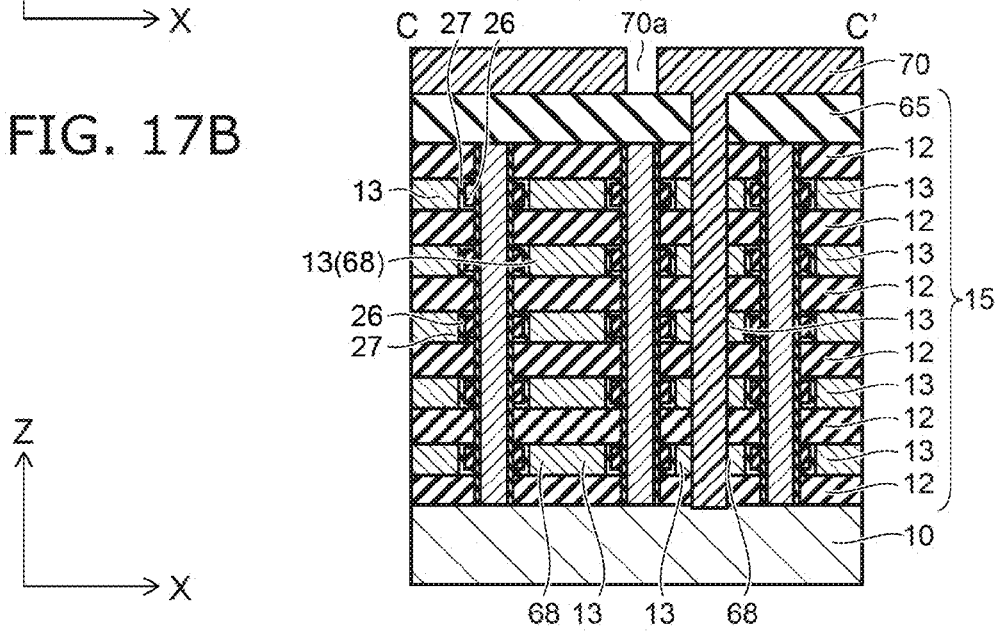
Figure 17C:
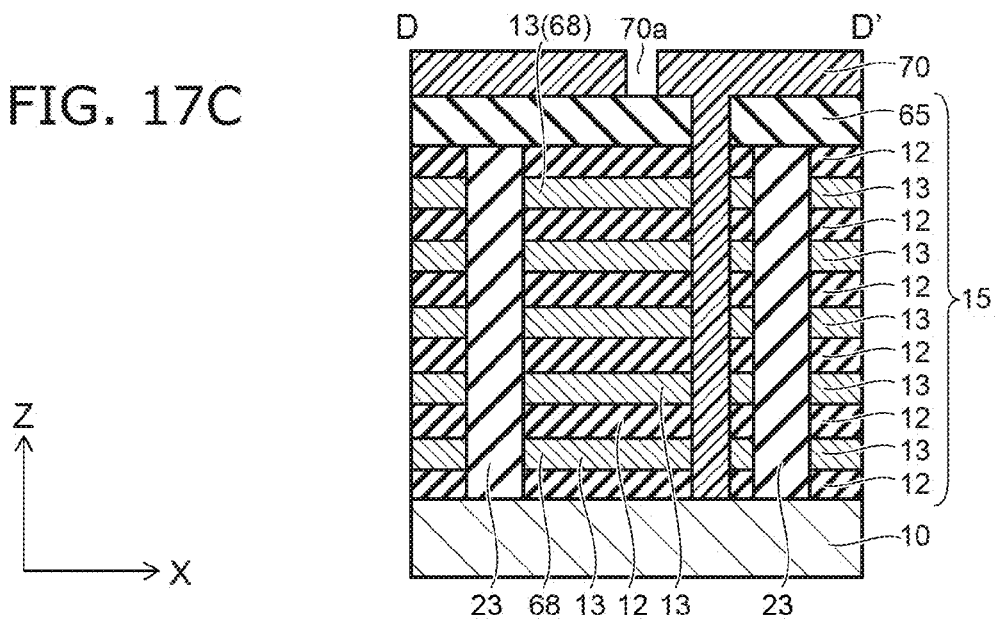

Next, as illustrated in FIGS. 17A to 17C, a resist material is deposited on the entire surface through coating, for example, and then patterned using the lithography method to form a resist mask 70. The resist mask 70 is also formed in the slit ST. Openings 70a are formed in the resist mask 70 in regions immediately above the cuts 23a in the insulating members 23.

Figure 18A:
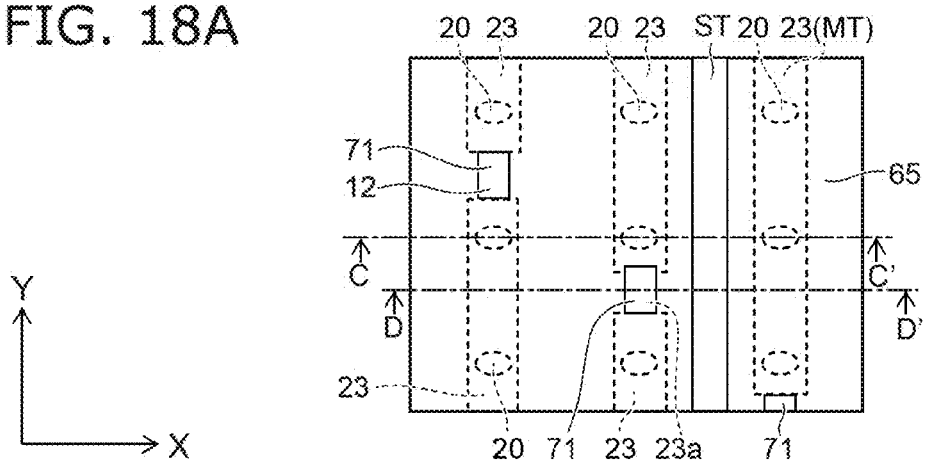
Figure 18B:
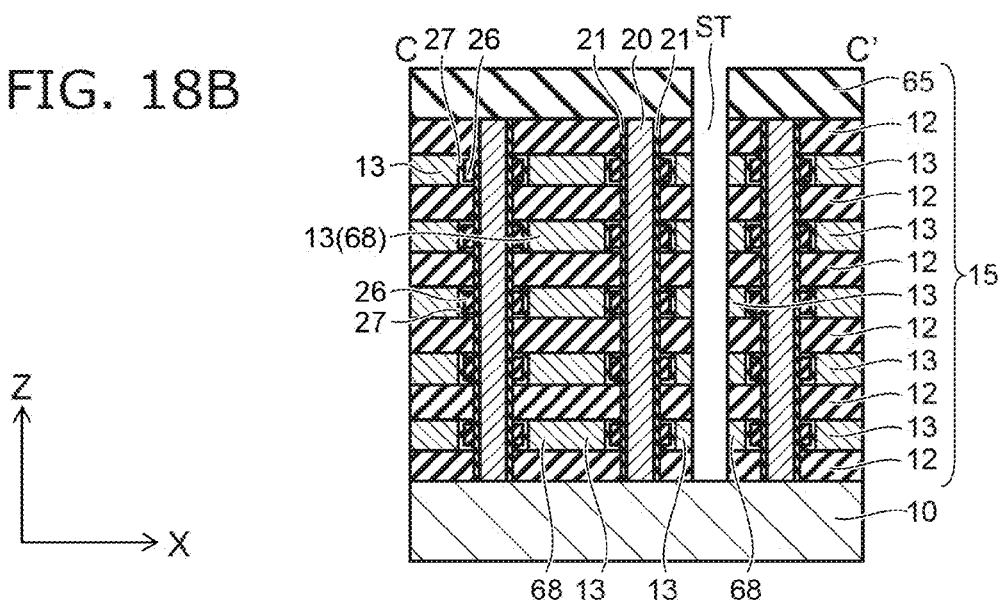
Figure 18C:
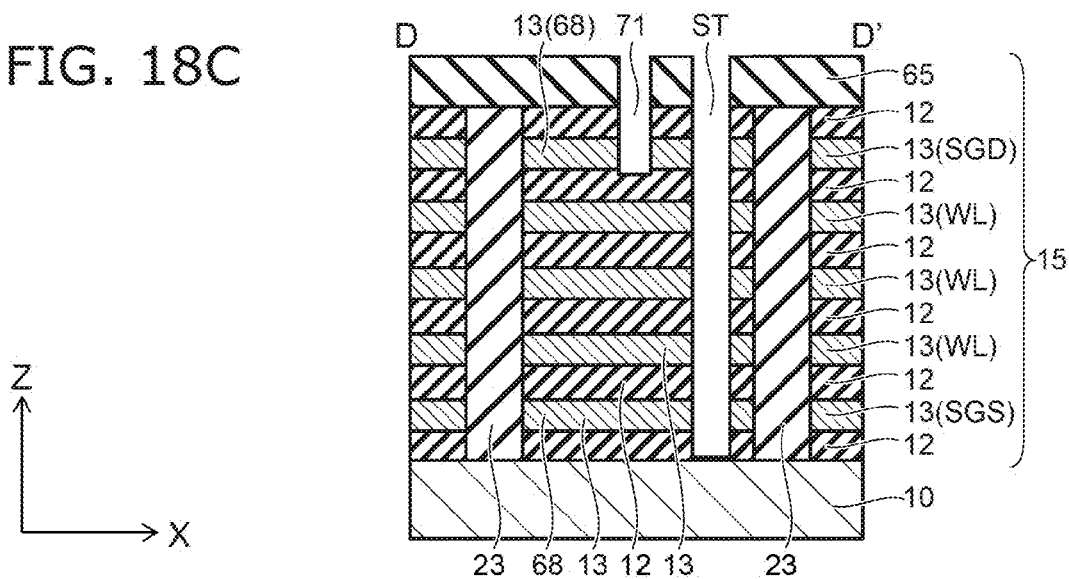

Next, as illustrated in FIGS. 18A to 18C, the stacked body 15 is selectively removed by carrying out anisotropic etching such as RIE using the resist mask 70 (see FIGS. 17A to 17C) as a mask. Openings 71 are formed in an upper portion of the stacked body 15 as a result. The openings 71 split one or more of the electrode films 13 (one, in FIG. 18C) from the top in the cuts 23a, but do not split the electrode films 13 therebelow. The resist mask 70 is then removed.

Figure 19A:
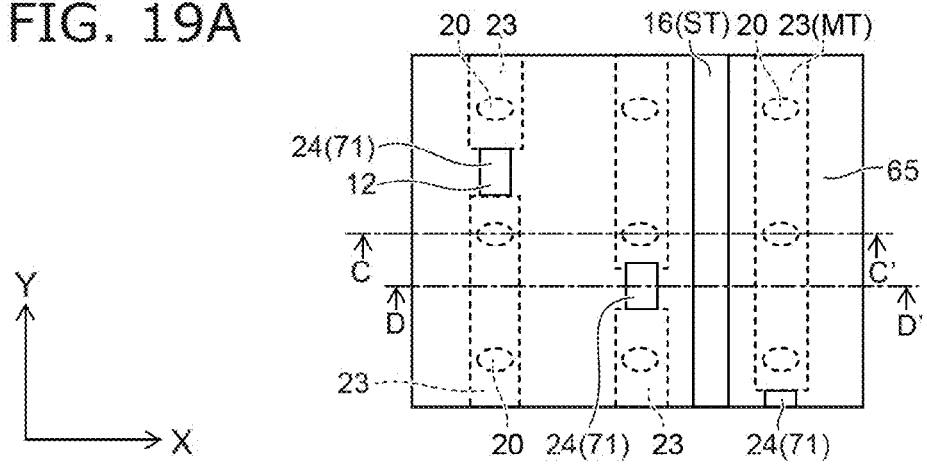
Figure 19B:
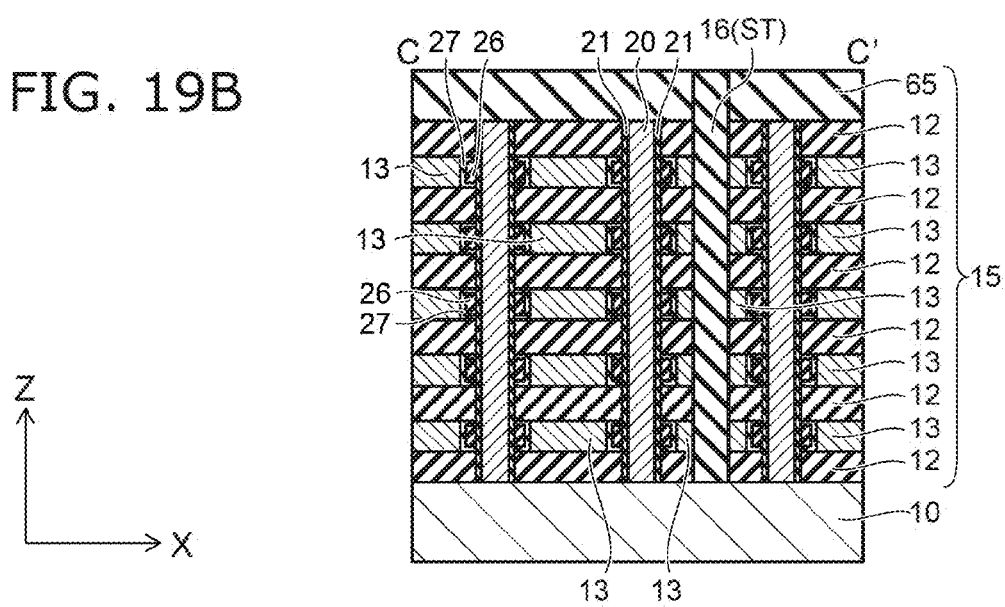
Figure 19C:
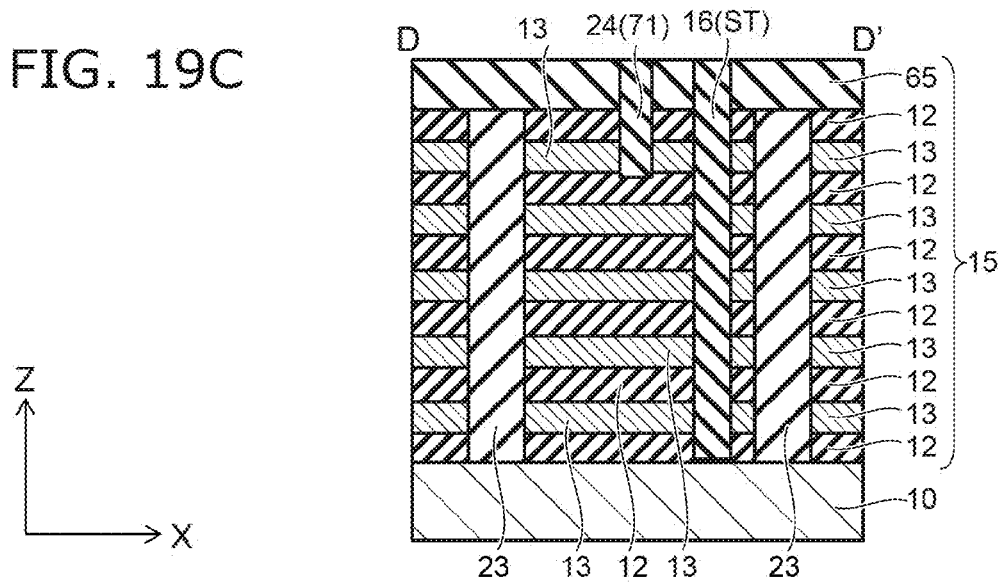

Next, as illustrated in FIGS. 19A to 19C, silicon oxide is deposited so as to fill the slit ST and the openings 71, and a flattening process such as CMP is then carried out. As a result, the insulating member 16 is formed in the slit ST and the insulating members 24 are formed in the openings 71. The insulating members 16 and 24 make contact with the main body portions 13a of the electrode films 13.

As a result, in the stacked body 15, one or more of the electrode films 13 from the top are split by the insulating members 23 and 24 into line-and-space shapes extending in the Y-direction, forming a plurality, such as six, of the upper select gate lines SGD. On the other hand, the electrode films 13 positioned lower than the insulating members 24 are split by the insulating members 23 but are not split by the insulating members 24, and thus form the web-shaped word lines WL or lower select gate lines SGS.

Next, the upper portion interconnects including source lines are formed on the stacked body 15. In this manner, the semiconductor memory device 1 according to the embodiment (see FIGS. 1 to 3) is manufactured.

Next, effects of the embodiment will be described.

In the embodiment, in the processes illustrated in FIGS. 5A to 6C, the plurality of memory trenches MT are formed so as to be separated from each other along the X-direction and the Y-direction. Accordingly, in the processes illustrated in FIGS. 7A to 7C, the cuts 23a are formed between insulating members 23 adjacent in the Y-direction. Through this, in the processes illustrated in FIGS. 15A to 15C, the sacrificial films 51 are also etched, and the spaces 68 are formed, in regions on the sides opposite from the insulating members 23 with respect to the slit ST. Additionally, in the processes illustrated in FIGS. 16A to 16C, the source gas of the conductive material can spread from the slit ST, and the electrode films 13 can be formed, in these regions as well.

As a result, the electrode films 13 can be formed between the memory trenches MT even if two or more rows of memory trenches MT are formed between two slits ST. In this case, two or more rows of silicon pillars 20 are disposed between two slits ST, and three or more interconnect portions 17 extending in the Y-direction are formed in the electrode films 13. In this manner, according to the embodiment, the number of slits ST can be made lower than the number of rows of silicon pillars 20, which makes it possible to increase the level of integration of the semiconductor memory device 1.

Additionally, according to the embodiment, in the processes illustrated in FIGS. 17A to 19C, the insulating members 24 are formed in regions directly above the cuts 23a in the insulating members 23. Accordingly, the electrode films 13 disposed in an upper portion of the stacked body 15 can be split between the rows of the silicon pillars 20. As a result, upper select gate lines SGD that are independent from row to row of the silicon pillars 20 can be provided.

Furthermore, according to the embodiment, in the processes illustrated in FIGS. 5A to 6C, the bridge portions 58 can be formed in the stacked body 15 by forming the plurality of memory trenches MT so as to be separated from each other along the Y-direction. Through this, the line-shaped portions 57 can be prevented from deforming or collapsing when the memory trenches MT are formed. To rephrase, the line-shaped portions 57 can be made finer and the level of integration of the memory cell transistor MC can be increased while ensuring reliability in the manufacturing process.

Furthermore, according to the embodiment, in the processes illustrated in FIGS. 5A to 6C, the volume of each memory trench MT can be reduced by forming the plurality of memory trenches MT so as to be separated from each other along the Y-direction. As a result, changes in the volume when firing the polysilazane and forming the insulating members 23 can be suppressed, and stress on the stacked body 15 can be reduced.

Note that if, for example, the memory trenches MT are formed having line shapes that extend continuously in the Y-direction, it is possible that the firing will cause the insulating members 23 to contract greatly and cracks will be formed in the stacked body 15. It is necessary to precisely control the firing conditions in order to prevent such cracks from forming.

Second Embodiment

Next, a second embodiment will be described.

Figure 20:
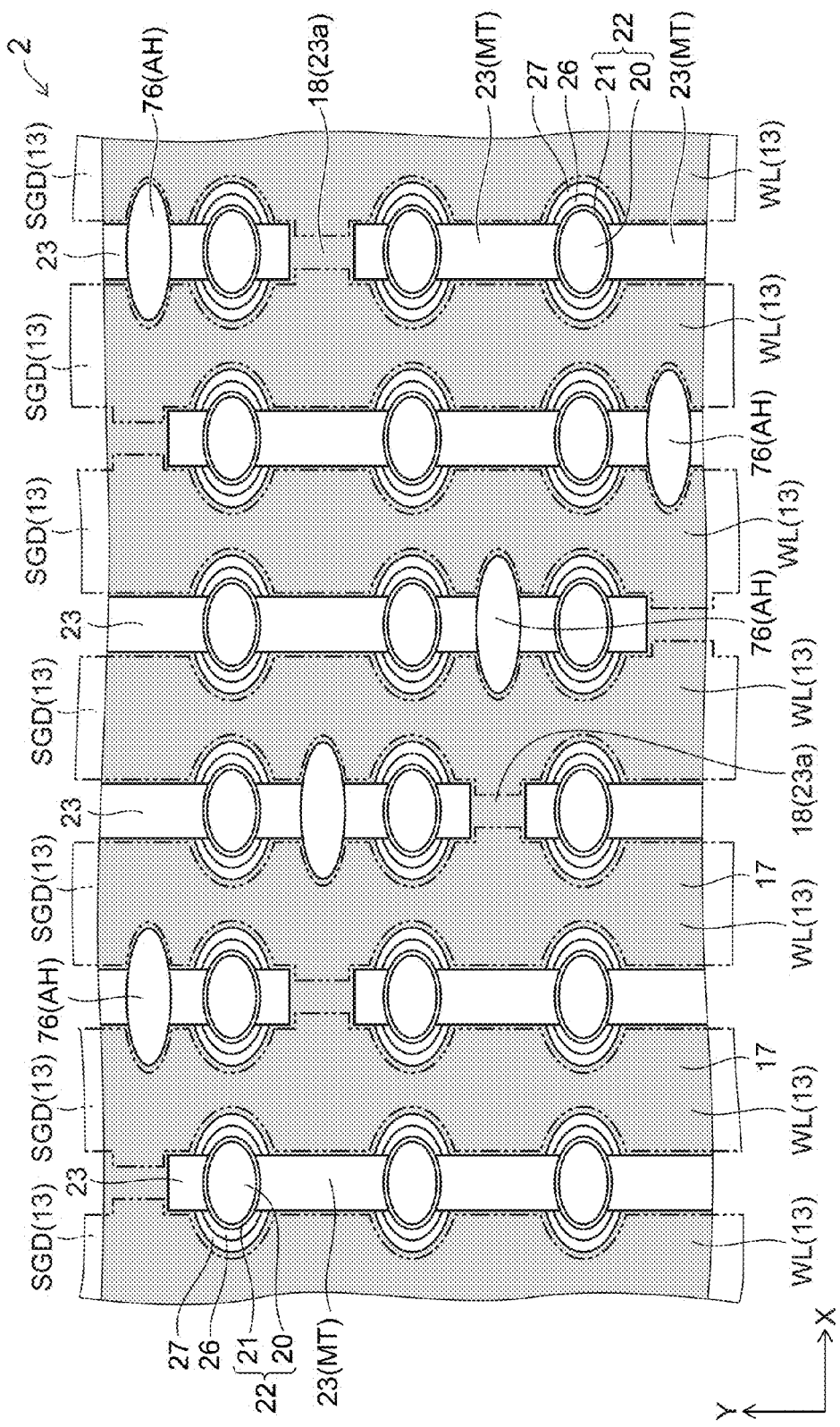
FIG. 20 is a plan view illustrating a semiconductor memory device according to a second embodiment.

FIG. 20 is a plan view illustrating a semiconductor memory device according to the embodiment.

As illustrated in FIG. 20, a semiconductor memory device 2 according to the embodiment differs from the semiconductor memory device 1 according to the above-described first embodiment (see FIG. 1) in that holes AH are formed instead of the line-shaped slit ST extending in the Y-direction. Each hole AH is shaped as a circular column or an elliptical column extending in the Z-direction. The holes AH are formed between silicon pillars 20 adjacent in the Y-direction, so as to split the insulating members 23.

An insulating member 76 made of silicon oxide, for example, is embedded in each hole AH. The insulating member 76 is disposed between interconnect portions 17 adjacent in the X-direction. The insulating member 23 is disposed between the column 22 and the insulating member 76. The length of the insulating member 76 in the X-direction is greater than the length of the insulating member 23 in the X-direction.

In a method of manufacturing the semiconductor memory device 2 according to the embodiment, in the processes illustrated in FIGS. 13A to 13C, the opening 67a is formed in a region that spans across a region directly above the insulating member 23 when the resist mask 67 is formed. Additionally, in the processes illustrated in FIGS. 19A to 19C, the insulating member 76 is embedded in each hole AH.

According to the embodiment, the line-shaped slit ST (see FIG. 1) is not formed, and thus the level of integration of the memory cell transistor MC (see FIG. 3) in the X-direction can be increased. Additionally, because the line-shaped slit ST (see FIG. 1) is not formed, both end portions of the insulating films 12 in the X-direction are joined to the insulating members 23 when the sacrificial films 51 (see FIGS. 14B and 14C) are removed in the processes illustrated in FIGS. 15A to 15C. This makes it possible for the insulating members 23 to support the insulating films 12 from both sides in the X-direction, which in turn makes it possible to prevent the insulating films 12 from sagging and closing off the spaces 68. The configuration, manufacturing method, and effects of the embodiment other than those described above are the same as the above-described first embodiment.

Third Embodiment

Next, a third embodiment will be described.

Figure 21:
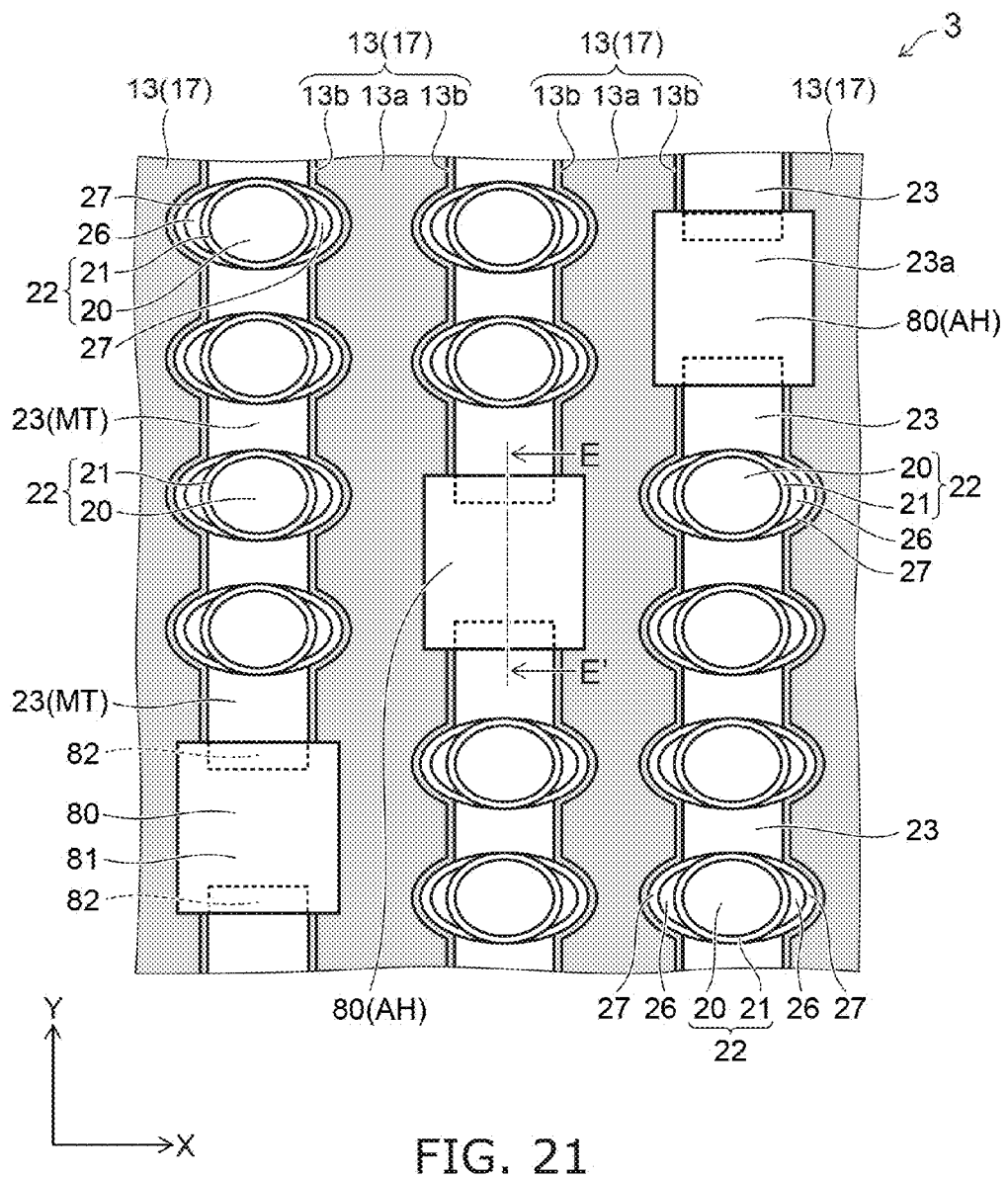
FIG. 21 is a plan view illustrating a semiconductor memory device according to a third embodiment.

FIG. 21 is a plan view illustrating a semiconductor memory device according to the embodiment.

Figure 22:
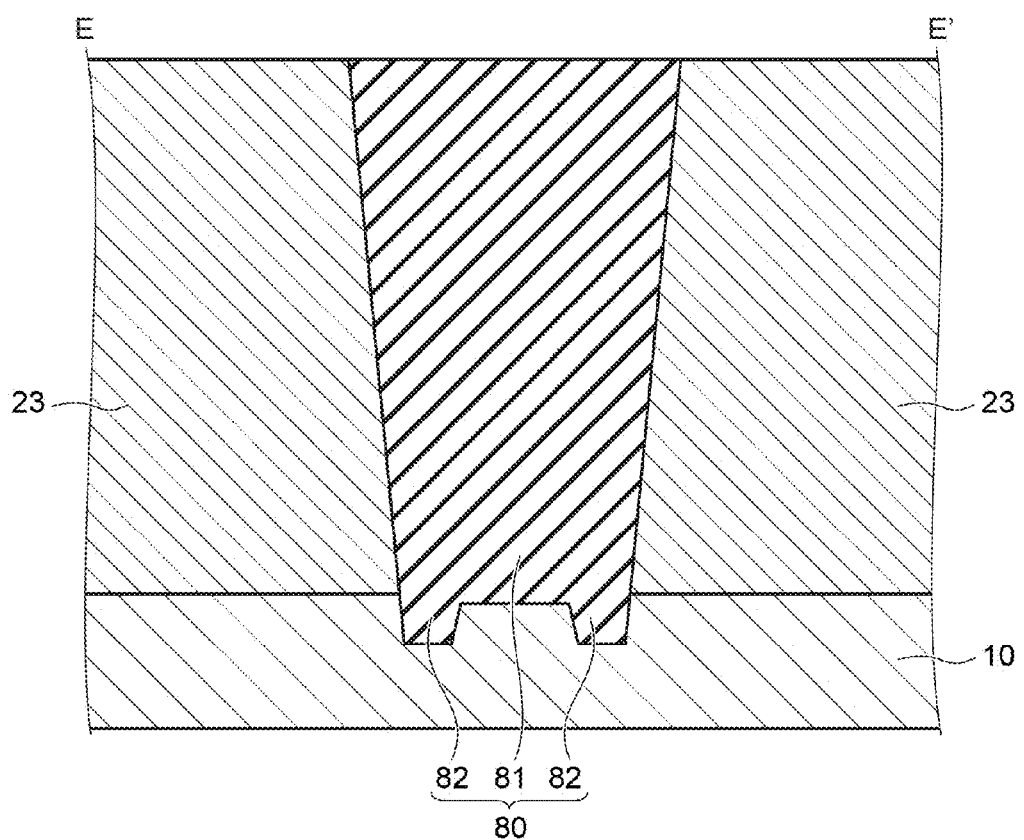
FIG. 22 is a cross-sectional view taken along line E-E' indicated in FIG. 21.

FIG. 22 is a cross-sectional view taken along line E-E indicated in FIG. 21.

As illustrated in FIG. 21, a semiconductor memory device 3 according to the embodiment differs from the semiconductor memory device 2 according to the above-described second embodiment (see FIG. 20) in that the holes AH are formed in regions that include the cuts 23a in the insulating members 23. An insulating member 80 made of silicon oxide, for example, is provided within each of the holes AH. The shape of the insulating member 80 is a substantially inverted quadrangular flat pyramid shape extending in the Z-direction. The length of the insulating member 80 in the X-direction is greater than the length of the insulating member 23 in the X-direction. The insulating member 80 passes through the stacked body 15 in the Z-direction, and a bottom end thereof penetrates into the silicon substrate 10.

In the X-direction, the insulating member 80 is disposed between electrode films 13. In the Y-direction, the insulating member 80 is disposed between insulating members 23. The insulating member 23 is disposed between the column 22 and the insulating member 80. Accordingly, in the embodiment, the column 22, the insulating member 23, and the insulating member 80 are disposed contiguously along the Y-direction, and split all of the electrode films 13 in line-and-space shapes extending in the Y-direction. In other words, in the semiconductor memory device 3 according to the embodiment, the bridge portions 18 (see FIG. 1) are not provided in the electrode films 13, and the word lines WL (see FIG. 3) and the lower select gate lines SGS (see FIG. 3) are, in addition to the upper select gate lines SGD (see FIG. 3), split from row to row of the silicon pillars 20 arranged in a single row along the Y-direction.

In the semiconductor memory device 3, the silicon pillars 20 are not arranged in a perfect matrix along the X-direction and the Y-direction, with the insulating member 80 disposed in a position where one or more, for example two, of the silicon pillars 20 are supposed to be. Additionally, the insulating members 24 (see FIG. 3) are not provided.

As illustrated in FIGS. 21 and 22, each insulating member 80 is provided with a main body portion 81 having a generally inverse quadrangular flat pyramid shape and two projecting portions 82 projecting downward from a lower surface of the main body portion 81. Viewed from the Z-direction, the projecting portions 82 are disposed in portions where the memory trenches MT and the holes AH overlap. Accordingly, the projecting portions 82 are formed in the lower surface of the main body portion 81, in regions in the center in the X-direction at both end portions in the Y-direction. There is no clear border face between the main body portion 81 and the projecting portions 82, and these parts are formed in a contiguous manner. The outer surface of the insulating member 80 may be rounded as a whole. A bottom end of the insulating member 80, or in other words, edges of the projecting portions 82, are positioned lower than bottom ends of the insulating members 23.

The barrier metal layer 13b of the electrode film 13 is disposed between the main body portion 13a of the electrode film 13 and the block insulating film 27 and between the main body portion 13a and the insulating member 23, but is not disposed between the main body portion 13a and the insulating member 80.

Next, a method of manufacturing the semiconductor memory device according to the embodiment will be described.

Figure 23:
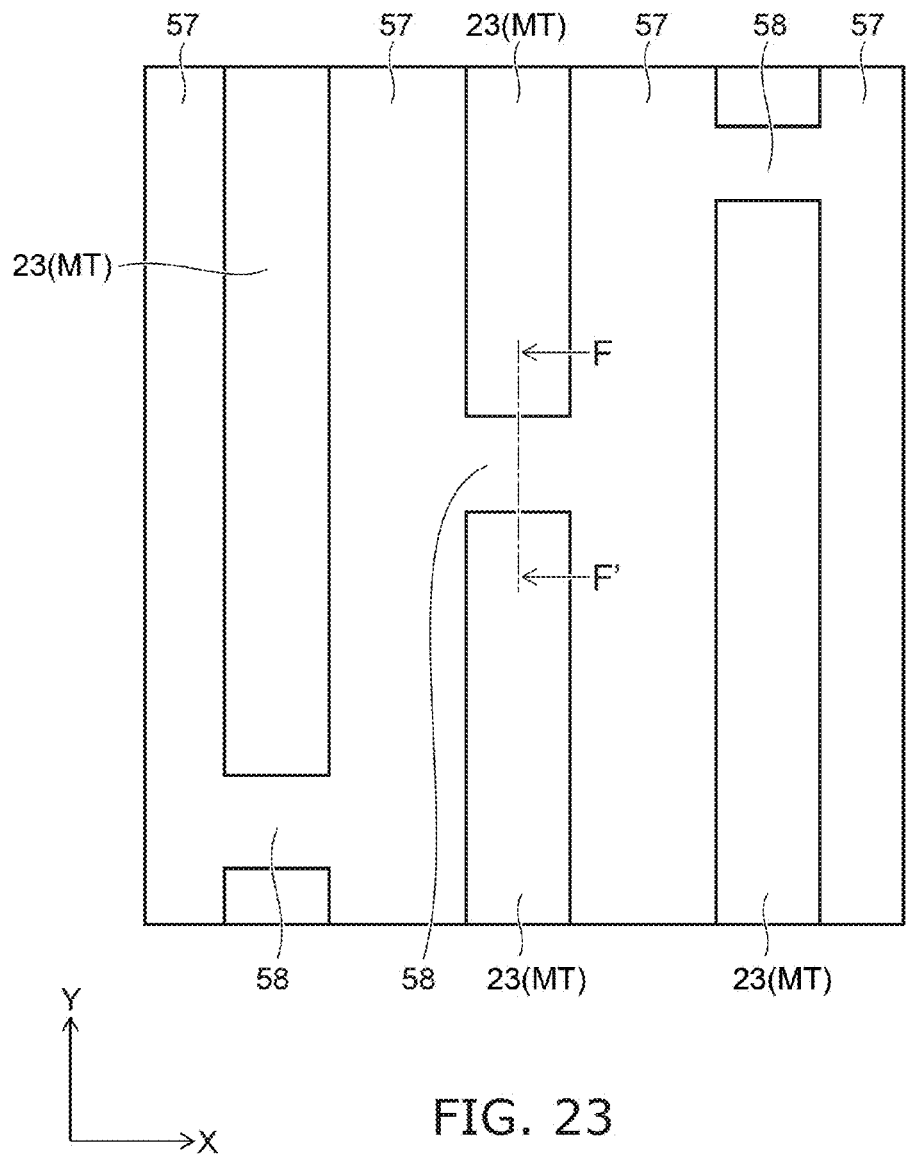
FIG. 23 is a plan view illustrating a method of manufacturing a semiconductor memory device according to the third embodiment.

FIG. 23 is a plan view illustrating the method of manufacturing the semiconductor memory device according to the embodiment.

Figure 24:
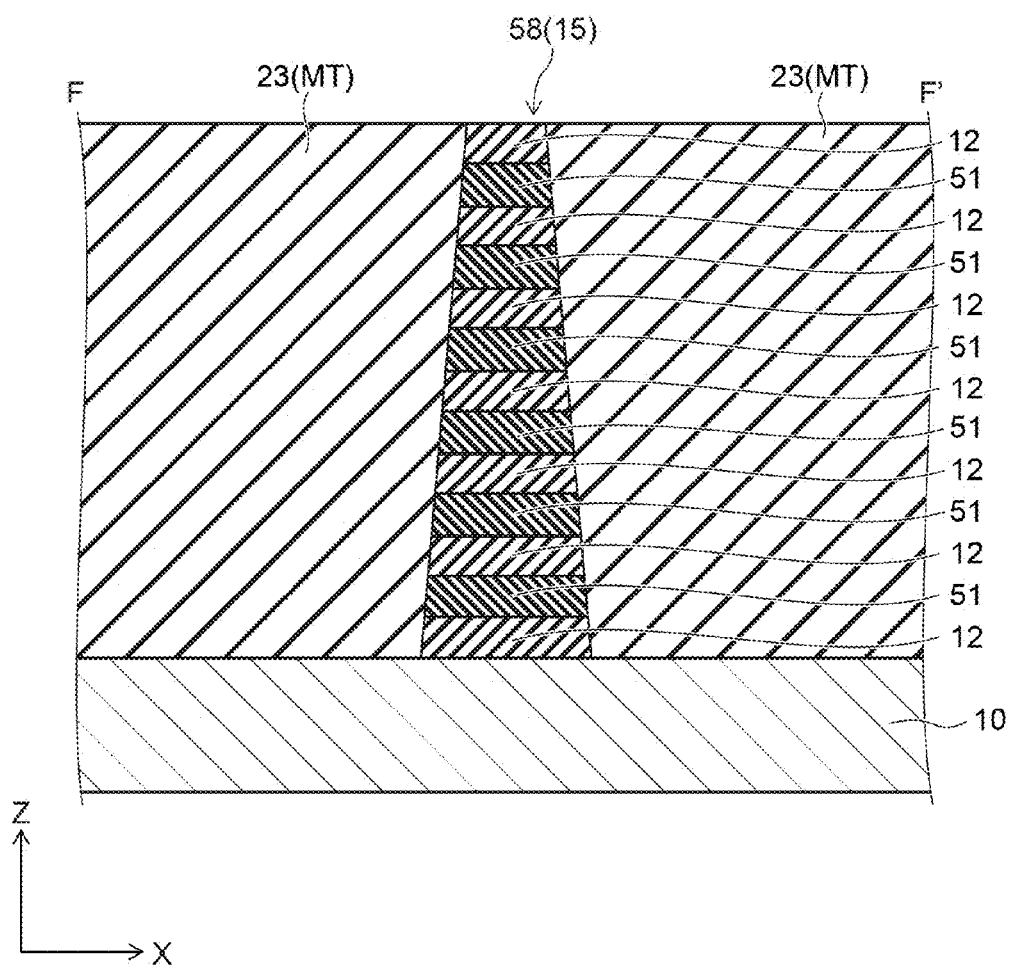
FIG. 24 is a cross-sectional view taken along line F-F' indicated in FIG. 23.

FIG. 24 is a cross-sectional view taken along line F-F' indicated in FIG. 23.

Figure 25:
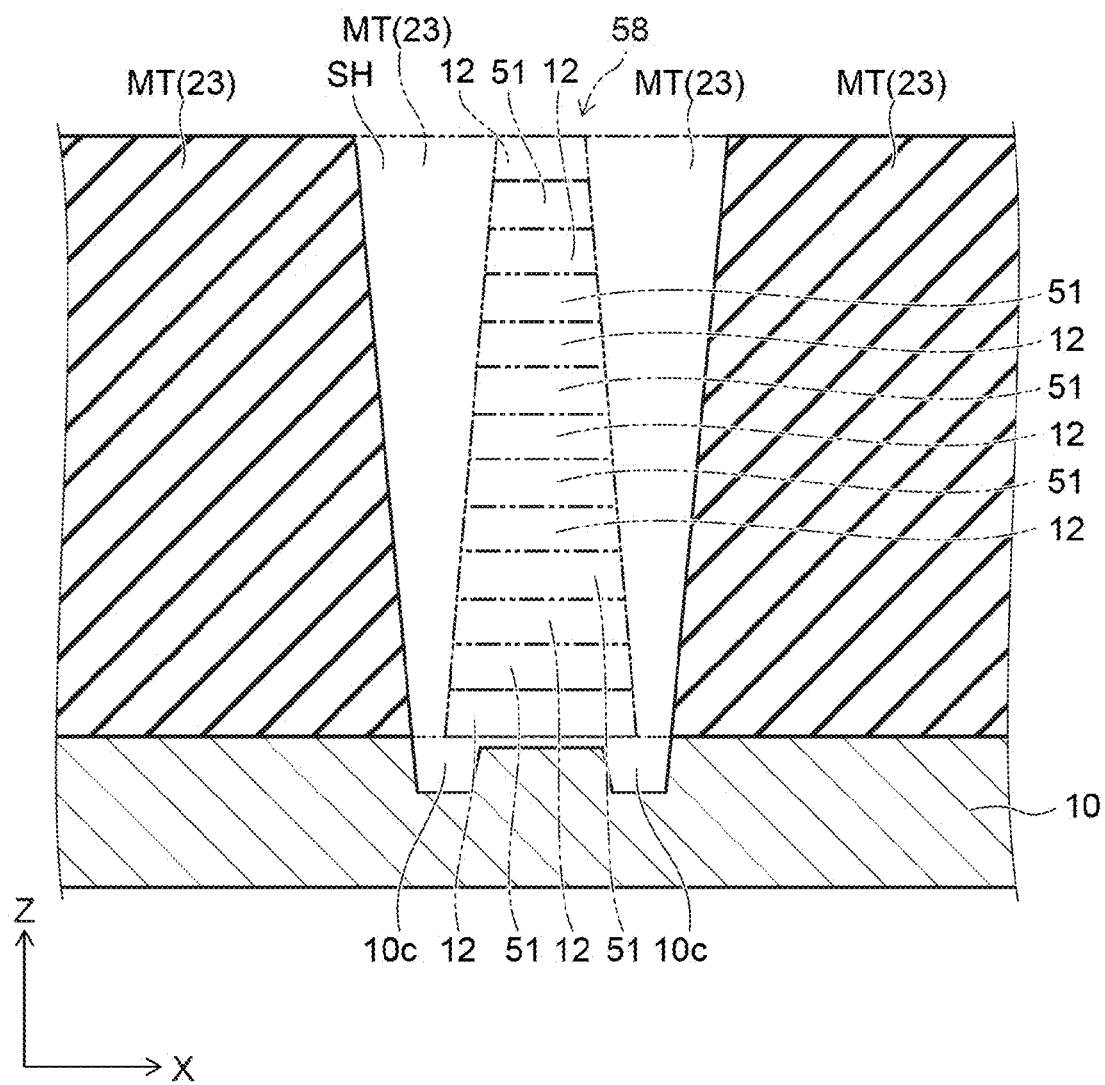
FIG. 25 is a cross-sectional view illustrating the method of manufacturing the semiconductor memory device according to the third embodiment.

FIG. 25 is a cross-sectional view illustrating the method of manufacturing the semiconductor memory device according to the embodiment.

First, the processes of FIGS. 4A to 7C are carried out, forming the memory trenches MT in the stacked body 15 and embedding the insulating members 23 in the memory trenches MT. Generally, when a given member is selectively removed through etching, it is difficult to form a perfectly vertical processing surface, and the processing surface will be tilted slightly relative to a vertical surface. Accordingly, as illustrated in FIGS. 23 and 24, when the memory trenches MT are formed through etching, an XZ cross-section of the bridge portions 58 in the stacked body 15 is substantially trapezoidal in shape.

Next, the processes illustrated in FIGS. 8A to 12C are carried out, forming a memory cell structure including the silicon pillars 20.

Next, similar processes as the processes illustrated in FIGS. 13A to 14C are carried out to form the holes AH through etching. At this time, as illustrated in FIG. 21, the holes AH are formed in regions that include the bridge portions 58 of the stacked body 15 and that overlap with end portions of the insulating members 23 disposed on both sides of the bridge portions 58 in the Y-direction. The silicon substrate 10 is exposed at bottom faces of the holes AH.

Accordingly, as illustrated in FIG. 25, both the bridge portions 58 and the insulating members 23 are etched when the holes AH are formed. This etching is carried out under conditions where the etching rate of silicon oxide is higher than the etching rate of silicon nitride. The bridge portions 58 include the insulating films 12 made of silicon oxide and the sacrificial films 51 made of silicon nitride, whereas the insulating members 23 are made only of silicon oxide. As such, the etching rate of the bridge portions 58 is slower than the etching rate of the insulating members 23. Accordingly, if an attempt is made to completely remove the bridge portions 58 at the regions where the holes AH are to be formed, the insulating members 23 will be over-etched, forming recesses 10c in the top surface of the silicon substrate 10. The state illustrated in FIG. 25 corresponds to the state illustrated in FIGS. 14A to 14C, and the region illustrated in FIG. 25 corresponds to the region illustrated in FIG. 24.

Next, the processes illustrated in FIGS. 15A to 16C are carried out, and the sacrificial films 51 are replaced with the electrode films 13.

Next, the processes illustrated in FIGS. 19A to 19C are carried out without carrying out the processes for forming the openings 71 illustrated in FIGS. 17A to 18C, and the insulating members 80 are embedded in the holes AH. At this time, the portions of the insulating members 80 embedded in the recesses 10c in the silicon substrate 10 serve as the projecting portions 82. In this manner, the semiconductor memory device 3 according to the embodiment is manufactured.

Next, effects of the embodiment will be described.

In the embodiment, the bridge portions 58 are formed in the stacked body 15 by forming the memory trenches MT so as to be separated in the Y-direction, in the same manner as the above-described first embodiment. Through this, the line-shaped portions 57 can be prevented from deforming or collapsing. Additionally, the volume of each memory trench MT can be reduced, which makes it possible to suppress damage to the stacked body 15 caused by the annealing performed when forming the insulating members 23.

Additionally, because the holes AH are formed instead of the line-shaped slit ST (see FIG. 1), the level of integration in the X-direction can be improved, in the same manner as in the above-described second embodiment. Additionally, the insulating films 12 can be supported by the insulating members 23 from both sides in the X-direction when the sacrificial films 51 are removed.

Furthermore, in the embodiment, the holes AH are formed in regions including the cuts 23a, and thus dead space where the silicon pillars 20 are not formed can be reduced and the level of integration in the Y-direction can be increased as compared to a case where the cuts 23a and the holes AH are formed in separate regions. In other words, in the process of forming the memory trenches MT, the cuts 23a become the bridge portions 58 of the stacked body 15 and suppress deformation and collapsing of the line-shaped portions 57, and in the process of removing the sacrificial films 51 and forming the electrode films 13, the cuts 23a function as supply channels for the etchant and the source gas. Thereafter, the electrode films 13 are split into line-and-space form by embedding the insulating members 80.

Additionally, in the embodiment, the electrode films 13 can be split into line-and-space form by the columns 22, the insulating members 23, and the insulating members 80, and thus it is not necessary to provide the insulating members 24 (see FIG. 3). Accordingly, the process of forming the openings 71 illustrated in FIGS. 17A to 18C is unnecessary, which increases the productivity of the semiconductor memory device.

The configuration, manufacturing method, and effects of the embodiment other than those described above are the same as the above-described first embodiment.

According to the embodiments described above, it is possible to realize a highly-integrated semiconductor memory device and a method of manufacturing the same. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
   a first electrode film including three or more first portions extending in a first direction and arranged along a second direction that intersects with the first direction, and a second portion connecting the first portions to each other;
   a plurality of semiconductor members arranged along the first direction between the first portions and extending in a third direction that intersects with a plane containing the first direction and the second direction; and
   a charge storage member disposed between each of the semiconductor members and each of the first portions, wherein
   the second portion is disposed between the semiconductor members,
   the second portion extends in the second direction, and
   both ends of the second portion in the second direction are connected to the first portions.

2. The semiconductor memory device according to claim 1, further comprising a first insulating member disposed on the second direction side when viewed from the first electrode film, the semiconductor member, and the charge storage member, the first insulating member taking the first direction as a longitudinal direction.

3. The semiconductor memory device according to claim 2, further comprising a second insulating member disposed between the first portions adjacent in the second direction and between the semiconductor members adjacent in the first direction.

4. The semiconductor memory device according to claim 1, further comprising:
   a first insulating member disposed between the first portions adjacent in the second direction, and extending in the third direction; and
   a second insulating member provided between the semiconductor member and the first insulating member.

5. The semiconductor memory device according to claim 4, wherein a length of the first insulating member in the second direction is greater than a length of the second insulating member in the second direction.

6. The semiconductor memory device according to claim 4, further comprising:
   a substrate connected to the semiconductor members; and
   three or more second electrode films extending in the first direction,
   wherein the first electrode film is disposed between the substrate and the second electrode films in the third direction.

7. The semiconductor memory device according to claim 6, wherein substrate-side end portion of the first insulating member is positioned closer to the substrate than substrate-side end portion of the second insulating member.

8. The semiconductor memory device according to claim 7, wherein a length of the first insulating member in the second direction is greater than a length of the second insulating member in the second direction.

9. The semiconductor memory device according to claim 7, wherein the first insulating member includes:
   a main body portion extending in the third direction; and
   two projecting portions projecting in the third direction from end portions on both sides in the first direction of a substrate-side surface of the main body portion.

10. The semiconductor memory device according to claim 1, further comprising an insulating member provided on the second portion.

11. The semiconductor memory device according to claim 10, further comprising second electrode films extending in the first direction, wherein the insulating member is provided between the second electrode films.

12. A semiconductor memory device comprising:
    a first electrode film including three or more first portions extending in a first direction and arranged along a second direction that intersects with the first direction, and a second portion connecting the first portions to each other;
    a plurality of semiconductor members arranged along the first direction between the first portions and extending in a third direction that intersects with a plane containing the first direction and the second direction; and
    a charge storage member disposed between each of the semiconductor members and each of the first portions, wherein
    the second portion is disposed between the semiconductor members, and
    the second portions disposed on both sides of one of the first portion in the second direction are located at mutually-different positions in the first direction.

13. A semiconductor memory device comprising:
    a plurality of first insulating members, arranged along a first direction and a second direction intersecting with the first direction, extending in a third direction that intersects with a plane containing the first direction and the second direction;
    a semiconductor member, extending in the third direction, disposed in a first one of spaces between first insulating members adjacent in the first direction;
    a second insulating member, disposed in a second one of the spaces, having a length in the second direction greater than a length of the first insulating member in the second direction;
    a plurality of electrode films arranged separated from each other in the third direction, each of the electrode films including
      a plurality of first portions extending in the first direction and disposed between the first insulating members adjacent in the second direction, and
      a second portion disposed in a third one of the spaces and connecting the plurality of first portions to each other, the second portion extending in the second direction and both ends of the second portion in the second direction being connected to the first portions; and
    a charge storage member disposed between the semiconductor member and the first portions.

14. The semiconductor memory device according to claim 13, further comprising
    a substrate connected to the semiconductor member,
    wherein the second insulating member includes:
      a main body portion extending in the third direction; and two projecting portions projecting in the third direction from end portions on both sides in the first direction of a substrate-side surface of the main body portion.

15. A method for manufacturing a semiconductor memory device, the method comprising:
forming a stacked body by forming a first film and a second film alternately on a substrate;
forming a plurality of first through-sections in the stacked body, each of the first through-section passing through the stacked body in a first direction in which the first film and the second film are stacked and extending in a second direction that intersects with the first direction, the first through-sections being arranged along the second direction and a third direction that intersects with the first direction and the second direction, and the first through-sections being separated from one another;
embedding a first insulating member in each of the first through sections;
forming a plurality of second through-sections in the first insulating members, the second through-sections extending in the first direction and arranged in a single row along the second direction;
forming recesses by recessing the second films in inner surfaces of the second through-sections;
forming charge storage members in the recesses;
forming semiconductor members in the second through-sections;
forming a third through-section in the stacked body;
forming spaces between the first films by removing the second films through the third through-section and spaces between adjacent first insulating members in the second direction;
forming electrode films within the spaces; and
embedding a second insulating member in the third through-section.

16. The method for manufacturing the semiconductor memory device according to claim 15, wherein the third through-section extends in the second direction, and when viewed from the plurality of first through-sections, the third through-section is disposed in a third direction that intersects with a plane containing the first direction and the second direction.

17. The method for manufacturing the semiconductor memory device according to claim 15, wherein the third through-section divides the first insulating member in the second direction.

18. The method for manufacturing the semiconductor memory device according to claim 15, wherein the third through-section is formed between the first insulating members adjacent in the second direction.

19. The method for manufacturing the semiconductor memory device according to claim 18, wherein the forming of the third through-section includes exposing the substrate by etching away the first film and the second film disposed between first insulating members adjacent in the second direction and etching away parts of the adjacent first insulating members facing each other.

20. The method for manufacturing the semiconductor memory device according to claim 19, wherein the etching is carried out under conditions where an etching rate of the first insulating member is higher than an etching rate of the second film.

\* \* \* \* \*